US012633326B2

(12) United States Patent
Qiang

(10) Patent No.: US 12,633,326 B2
(45) Date of Patent: May 19, 2026

(54) PROCESSING METHOD AND APPARATUS FOR CHECK PIN OF MEMORY, DEVICE, STORAGE MEDIUM, AND COMPUTER PROGRAM PRODUCT

(71) Applicant: Tencent Technology (Shenzhen) Company Limited, Shenzhen (CN)

(72) Inventor: Peng Qiang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 134 days.

(21) Appl. No.: 18/604,370

(22) Filed: Mar. 13, 2024

(65) Prior Publication Data

US 2024/0274163 A1     Aug. 15, 2024

Related U.S. Application Data

(63) Continuation of application No. PCT/CN2023/084707, filed on Mar. 29, 2023.

(30) Foreign Application Priority Data

May 9, 2022     (CN) ......................... 202210497004.X

(51) Int. Cl.
*G11C 7/10*         (2006.01)
*G11C 7/22*         (2006.01)
*G11C 29/52*        (2006.01)

(52) U.S. Cl.
CPC .......... *G11C 7/1066* (2013.01); *G11C 7/1069* (2013.01); *G11C 7/222* (2013.01); *G11C 29/52* (2013.01)

(58) Field of Classification Search
CPC ....... G11C 7/1066; G11C 7/1069; G11C 7/22; G11C 29/52; G11C 7/222
See application file for complete search history.

(56) References Cited

U.S. PATENT DOCUMENTS 6,016,282 A     1/2000 Keeth
2006/0052961 A1     3/2006 Best
(Continued)

FOREIGN PATENT DOCUMENTS

CN     101089990 A     12/2007
CN     103608793 A     2/2014
(Continued)

OTHER PUBLICATIONS

Tencent Technology, ISR, PCT/CN2023/084707, Jun. 23, 2023, 2 pgs.

(Continued)

*Primary Examiner* — Han Yang
(74) *Attorney, Agent, or Firm* — Morgan, Lewis & Bockius LLP

(57)     ABSTRACT

This application relates to a processing method for configuring a check pin of a memory performed by a computer device. The method includes: receiving a first data signal and a sampling pulse signal returned by a check pin in a target memory; time-shifting each first data signal through a delay circuit to align a target level value in each first data signal after the time shift with the sampling pulse signal to obtain a first delay parameter; and when receiving a second data signal returned by the check pin in the target memory, time-shifting a target data signal in each second data signal through the delay circuit to align target level values in all second data signals after the time shift to obtain a second delay parameter, determining a sampling delay parameter of the check pin based on the first delay parameter and the second delay parameter.

18 Claims, 16 Drawing Sheets

(56) References Cited

U.S. PATENT DOCUMENTS

| | | | |
|---|---|---|---|
| 2007/0008791 A1 | 1/2007 | Butt et al. | |
| 2015/0186328 A1 | 7/2015 | Bonen et al. | |
| 2017/0331493 A1 | 11/2017 | Yu et al. | |
| 2018/0122434 A1* | 5/2018 | Lee ..................... | G06F 13/1673 |
| 2023/0267254 A1* | 8/2023 | Chen ................ | G11C 29/12015 |
| | | | 716/108 |

FOREIGN PATENT DOCUMENTS

| | | | |
|---|---|---|---|
| CN | 108874686 A | 11/2018 | |
| CN | 108922571 A | 11/2018 | |
| CN | 115116530 A | 9/2022 | |

OTHER PUBLICATIONS

Tencent Technology, WO, PCT/CN2023/084707, Jun. 23, 2023, 5 pgs.
Tencent Technology, IPRP, PCT/CN2023/084707, Nov. 7, 2024, 6 pgs.
Tencent Technology, Extended European Search Report, EP Patent Application No. 23802527.4, Feb. 11, 2025, 11 pgs.

* cited by examiner

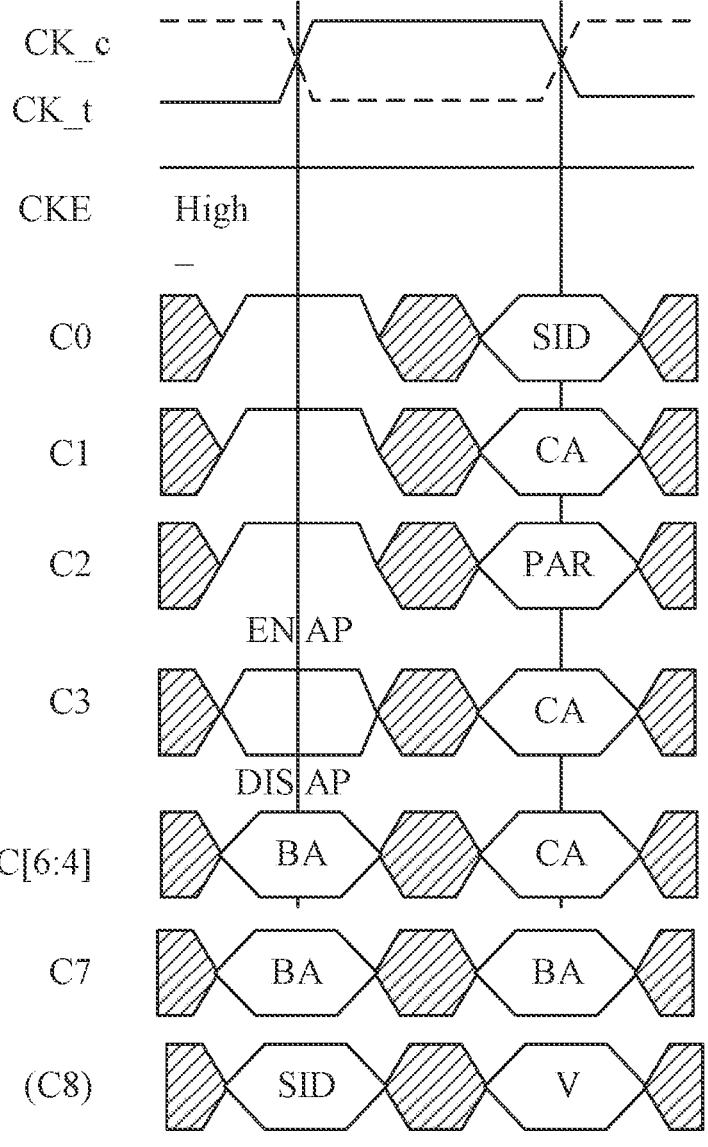
BA = bank address                    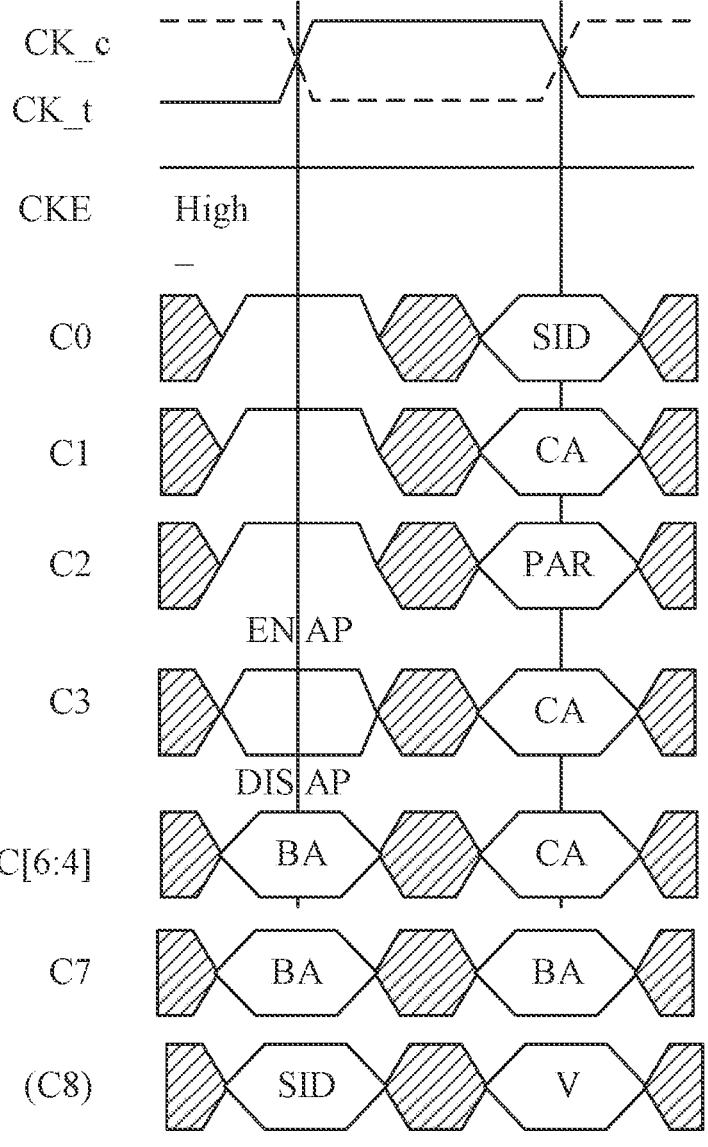 No need to pay attention
CA = column address
PAR = parity check
SID = stack ID
EN AP = automatically precharge enabled
DIS AP = automatically precharge disabled
FIG. 2

1. tDQSCK may span multiple clock periods.
2. A burst length of 4 is shown.
3. Early/Late data transition of a DQ or DBI can vary within a burst.
4. Da,a+1,a+2,a+3=data-out for READ command a.
   D=last data-out from previous READ command (not if first READ after reset, MRS, self refresh or write-to-read).

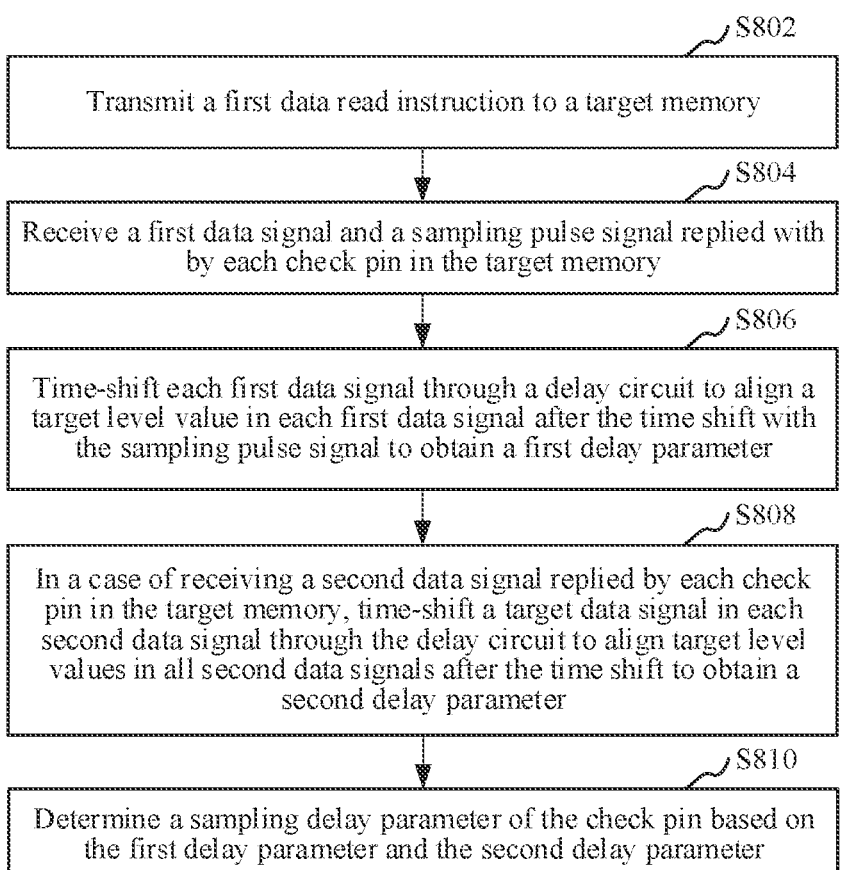

S802

Transmit a first data read instruction to a target memory

S804

Receive a first data signal and a sampling pulse signal replied with by each check pin in the target memory

S806

Time-shift each first data signal through a delay circuit to align a target level value in each first data signal after the time shift with the sampling pulse signal to obtain a first delay parameter

S808

In a case of receiving a second data signal replied by each check pin in the target memory, time-shift a target data signal in each second data signal through the delay circuit to align target level values in all second data signals after the time shift to obtain a second delay parameter

S810

Determine a sampling delay parameter of the check pin based on the first delay parameter and the second delay parameter

FIG. 8

Mode register 7 (MR7)

| Field | Bit | Function description |
|-------|-----|----------------------|
| CATTRIP | OP7 | 0 - Clear CATTRIP pin (default)<br>1 - Assert the CATTRIP pin to "1" |
| Reserved word | OP6 | 0 |
| DWORD MISR control | OP[5:3] | Only valid when a loopback function is enabled under OP0<br>000 - Preset value<br>MISR/lfsr of DWORD is 0xAAAAh, and LFSR_COMPARE_STICKY bits of DWORD are all set to 0.<br>001 - LFSR mode (read direction)<br>010 - Register mode (read and write instructions)<br>DWORD write is captured directly into a MISR register without compression. The MISR register will include the most recent write data.<br>011 - MISR mode (write direction)<br>100 - LFSR compare mode (write direction) |
| DWORD read multiplex control | OP[2:1] | Only valid when a loopback function is enabled under OP0<br>00 - Reserved word<br>01 - Reply data from the MISR register (default)<br>10 - Reply data from an Rx path sampler<br>11 - Reply LFSR COMPARE STICKY (optional) |
| DWORD loopback | OP0 | 0 - Disabled (default)<br>1 - Enabled; supporting a link test circuit<br>All write and read come to/from MISR<br>(No additional activation required for write/read - column addresses are ignored in this mode) |

FIG. 9

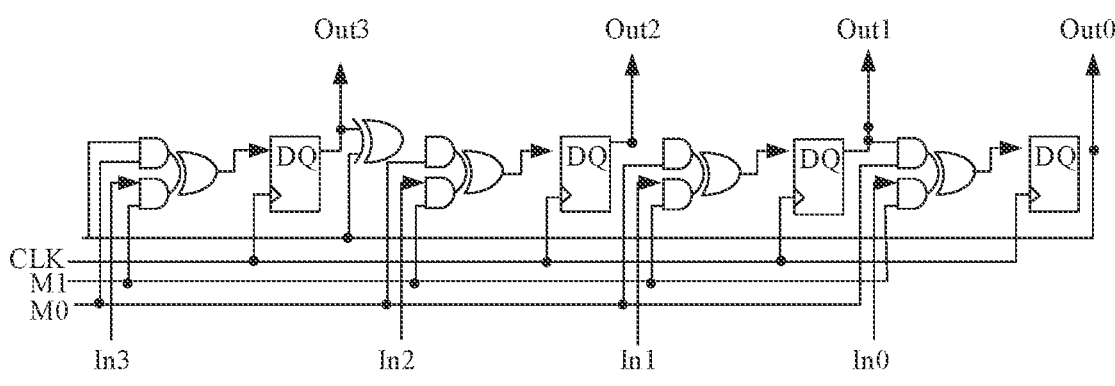

FIG. 10

Mode register 0 (MR0)

| Field | Bit | Function description |
|---|---|---|
| Test mode | OP7 | 0 - Normal operation (default)<br>1 - Test mode (vendor specific) |
| Address, instruction bus, and row and column bus parity check | OP6 | 0 - Disabled (default)<br>1 - Enabled |
| DQ bus write parity check | OP5 | 0 - Disabled (default)<br>1 - Enabled |
| DQ bus read parity check | OP4 | 0 - Disabled (default)<br>1 - Enabled |
| Reserved word | OP3 | 0 |
| Temperature compensated self-refresh (TCSR) | OP2 | 0 - Disabled<br>1 - Enabled (default) |
| Write DBIac | OP1 | 0 - Disabled<br>1 - Enabled (default) |
| Read DBIac | OP0 | 0 - Disabled<br>1 - Enabled (default) |

PROCESSING METHOD AND APPARATUS FOR CHECK PIN OF MEMORY, DEVICE, STORAGE MEDIUM, AND COMPUTER PROGRAM PRODUCT

CROSS-REFERENCE TO RELATED APPLICATIONS

This application is a continuation application of PCT Patent Application No. PCT/CN2023/084707, entitled "PROCESSING METHOD AND APPARATUS FOR CHECK PIN OF MEMORY, DEVICE, STORAGE MEDIUM, AND COMPUTER PROGRAM PRODUCT" filed on Mar. 29, 2023, which claims priority to Chinese Patent Application No. 202210497004.X, entitled "PROCESSING METHOD AND APPARATUS FOR CHECK PIN OF MEMORY, DEVICE, STORAGE MEDIUM, AND COMPUTER PROGRAM PRODUCT", filed with the China National Intellectual Property Administration on May 9, 2022, all of which is incorporated herein by reference in its entirety.

FIELD OF THE TECHNOLOGY

This application relates to the field of computer technologies, and in particular, to a processing method and apparatus for a check pin of a memory, a device, a storage medium, and a computer program product.

BACKGROUND OF THE DISCLOSURE

High bandwidth memory (HBM) is a new type of high-speed and high-bandwidth internal memory and is mainly used in the field of artificial intelligence chips. A transmission line of a read data signal of the HBM is easily affected by a chip process, an operating voltage, an ambient temperature, and crosstalk between signals and causes failure, resulting in errors in the transmitted read data signal. Therefore, whether the read data signal is sent incorrectly needs to be detected.

In a traditional detection method, the read data signal is mainly transmitted together with a parity check (PAR) signal of the read data signal and a sampling pulse signal of the read data signal, so that a receiver can sample the parity check signal based on the sampling pulse signal and then check, based on check information, whether the read data signal is transmitted incorrectly.

However, the parity check signal may also be affected by the chip process, the operating voltage, the ambient temperature, and the crosstalk between signals, causing the parity check signal and the sampling pulse signal to deviate. When the receiver samples the parity check signal based on the sampling pulse signal, a sampling error results in obtaining erroneous check information, which leads to an error in a check result of a data signal.

SUMMARY

According to embodiments of this application, a processing method and apparatus for a check pin of a memory, a device, a storage medium, and a computer program product are provided.

According to a first aspect, this application provides a processing method for configuring a check pin of a memory performed by a computer device, and the method includes:

transmitting a first data read instruction to a target memory;

receiving a first data signal and a sampling pulse signal returned by the check pin in the target memory;

time-shifting each first data signal through a delay circuit to align a target level value in each first data signal after the time shift with the sampling pulse signal to obtain a first delay parameter;

receiving a second data signal returned by each check pin in the target memory;

time-shifting a target data signal in each second data signal through the delay circuit to align target level values in the second data signals after the time shift to obtain a second delay parameter; and determining a sampling delay parameter of the check pin based on the first delay parameter and the second delay parameter.

According to a second aspect, this application further provides a computer device. The computer device includes a memory and a processor, the memory stores a computer program that, when executed by the processor, causes the computer device to implement the aforementioned method.

According to a third aspect, this application further provides a non-transitory computer-readable storage medium. The computer-readable storage medium stores a computer program, and the computer program, when executed by a processor of a computer device, causing the computer device to implement the aforementioned method.

Details of one or more embodiments of this application are provided in the accompanying drawings and descriptions below. Other features and advantages of this application are illustrated in the specification, the accompanying drawings, and the claims.

BRIEF DESCRIPTION OF THE DRAWINGS

The accompanying drawings described herein are used for providing a further understanding of this application, and form part of this application. Exemplary embodiments of this application and descriptions thereof are used for explaining this application, and do not constitute any inappropriate limitation to this application. In the accompanying drawings:

FIG. 2 is a schematic diagram of a read instruction according to an embodiment.

FIG. 8 is a schematic flowchart of a processing method for a check pin of a memory according to an embodiment.

FIG. 9 is a schematic diagram of a function of a mode register MR7 according to an embodiment.

FIG. 10 is a schematic diagram of a MISR circuit according to an embodiment.

FIG. 11 is a schematic diagram of a function of a mode register MR0 according to an embodiment.

DESCRIPTION OF EMBODIMENTS

To make the objectives, technical solutions, and advantages of this application clearer and more understandable, this application is further described in detail below with reference to accompanying drawings and embodiments. It is to be understood that the specific embodiments described herein are only used for explaining this application, and are not used for limiting this application.

Figure 1:
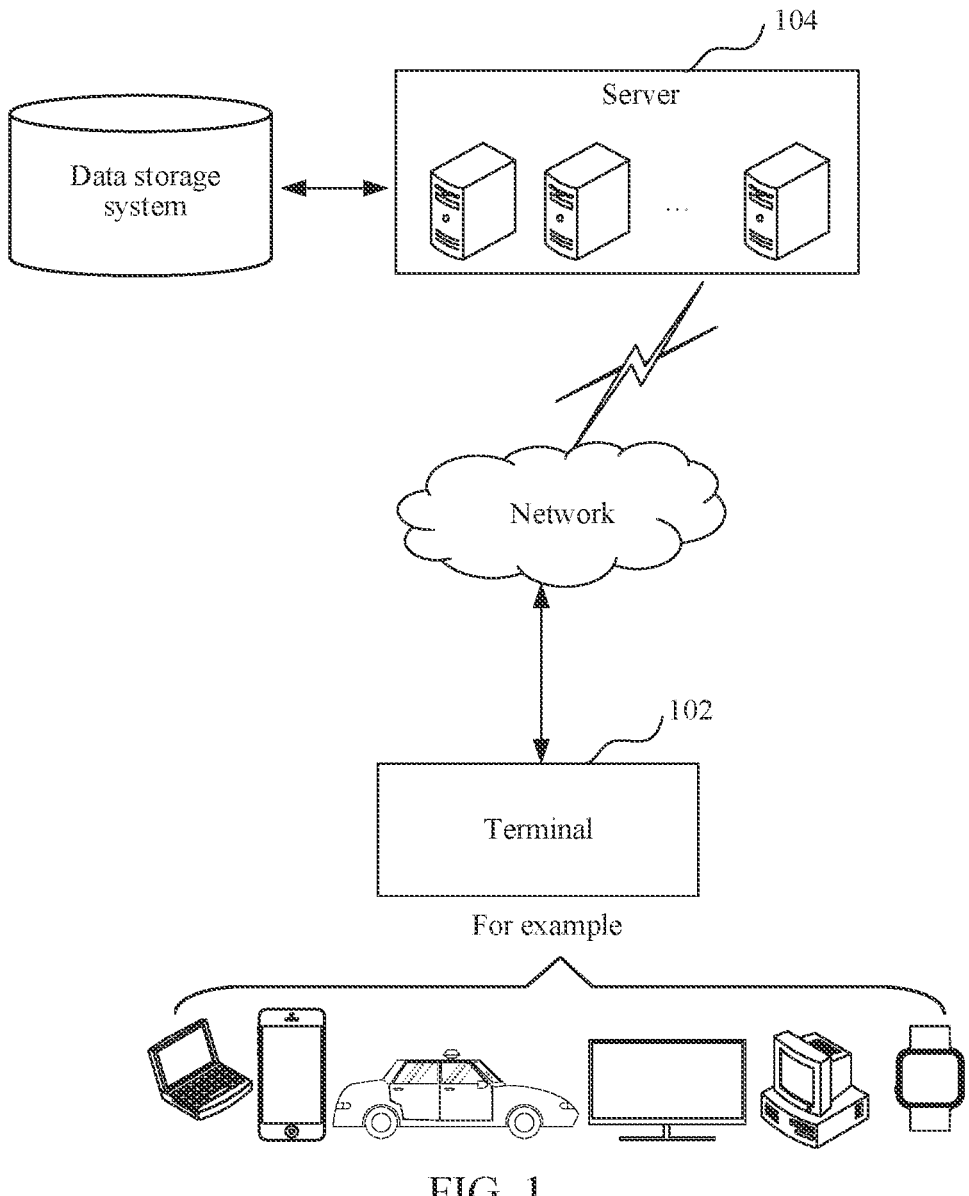
FIG. 1 is a diagram of an application environment of a processing method for a check pin of a memory according to an embodiment.

The processing method for a check pin of a memory provided in embodiments of this application is performed by a computer device, and may be specifically applied to an application environment as shown in FIG. 1. A terminal 102 communicates with a server 104 through a network. The processing method for a check pin of a memory may be performed by the terminal 102 or the server 104, or may be performed by the terminal 102 and the server 104 in cooperation. In some embodiments, the terminal 102 and the server 104 are provided with a memory controller, and the processing method for a check pin of a memory may be specifically performed by the memory controller. If the processing method for a check pin of a memory is performed by the terminal 102, the terminal 102 transmits a first data read instruction to a target memory; receives a first data signal and a sampling pulse signal returned by each check pin in the target memory; time-shifts each first data signal through a delay circuit to align a target level value in each first data signal after the time shift with the sampling pulse signal to obtain a first delay parameter; when receiving a second data signal returned by each check pin in the target memory, time-shifts a target data signal in each second data signal through the delay circuit to align target level values in all second data signals after the time shift to obtain a second delay parameter; and determines a sampling delay parameter of the check pin based on the first delay parameter and the second delay parameter.

The terminal 102 may be a smartphone, a tablet computer, a notebook computer, a desktop computer, a smart speaker, a smartwatch, a smart voice interaction device, a smart household appliance, and a vehicle terminal that are integrated with an AI chip, but is not limited thereto. The AI chip may be a chip that combines an AI processor and a memory (such as a high bandwidth memory). The memory may include a data storage region and a controller, or the controller may exist in a separate form and control the memory.

The server 104 may be an independent physical server integrated with an AI chip, or a service node in a blockchain system. Each service node in the blockchain system forms a peer-to-peer (P2P) network. A P2P protocol is an application layer protocol running above the transmission control protocol (TCP).

In addition, the server 104 may alternatively be a server cluster formed by a plurality of physical servers that are integrated with an AI chip, or may be a cloud server that provides basic cloud computing services such as a cloud service, a cloud database, cloud computing, a cloud function, cloud storage, a network service, cloud communication, a middleware service, a domain name service, a security service, a content delivery network (CDN), big data, and an AI platform.

The terminal 102 and the server 104 may be connected through a communication connection mode such as a Bluetooth, a USB (Universal Serial Bus), or a network. This is not limited in this application.

Before the processing method for a check pin of a memory provided in the embodiments of this application is described, a process of a memory reading data in a traditional solution is first described.

Figure 3:
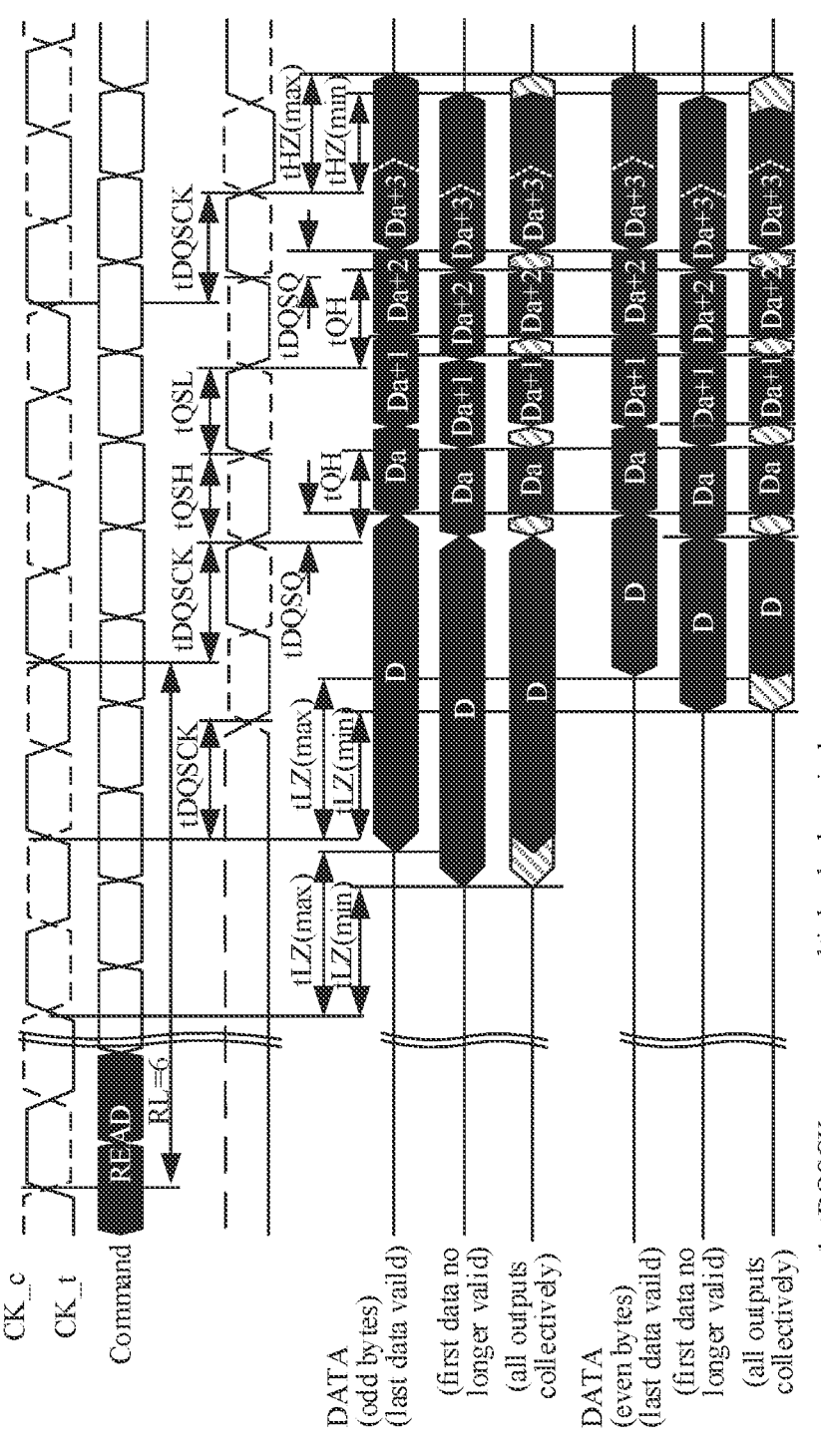
FIG. 3 is a schematic diagram of read data according to an embodiment.

In the traditional solution, after the computer device transmits a burst data read instruction to a target memory, the target memory reads read data based on the received read instruction and replies the computer device with the read data. FIG. 2 is a schematic diagram of a READ (read) instruction transmitted in the traditional solution. A burst length may be 2 or 4. FIG. 3 is a schematic diagram of the read data (DQ) replied with based on the READ (read) instruction. Relevant timing parameters included in the figure are as follows: tDQSCK (min/max) is a time range between minimum and maximum time between a rising edge of RDQS_c (or a falling edge of RDQS_t) and a rising edge of CK_c (or a falling edge of CK_t); tDQSCK describes a time delay between the rising edge of RDQS and the rising edge of CK; tQSH describes a time delay for a RDQS signal to remain high level; tQSL describes a time delay for the RDQS signal to remain low level; LZ (min/max) describes a time range between minimum and maximum time for the read data to change from a high-impedance state to a low-impedance state; tHZ (min/max) describes a time range between minimum and maximum time for the read data to change from a low-impedance state to a high-impedance state; tDQSQ describes a time delay between the rising edge of RDQS_t (or the falling edge of RDQS_c) and reading of DQ, DM, and DBI data; tQH describes a time delay between the rising edge of RDQS_t (or the falling edge of RDQS_c) and a moment when the reading of DQ, DM and DBI data remains stable; RDQS (Read DQ Strobe) is a read DQ strobe, and may also be referred to as a sampling pulse signal, where DQ is a read data bus, and may also be referred to as read data; DM (Data Mask) is a data mask; and DBI (Data Bus Inversion) is data bus inversion. Burst means a manner in which adjacent storage units in the same row of the target memory continuously transmit data. A quantity of cycles of continuous transmission is a burst length (BL for short).

In the traditional solution, after the computer device transmits a burst data read instruction to the target memory, the target memory not only replies the computer device with the read data based on the received read instruction, but also replies the computer device with parity check data of the read data. A parity check signal corresponding to the parity check data may be transmitted simultaneously with a read data signal of the read data, or may be transmitted later than the read data signal of the read data. A PL (parity latency, parity check latency) parameter is usually used to describe a quantity of cycles in which the parity check signal is delayed relative to the read data signal. The PL parameter may be specifically configured to 0 to 3 clock cycles. The configuration of the PL parameter is controlled and completed by a mode register 4 (MR4) of the HBM. Details are shown in the table below.

TABLE 1

| Field | Control bit | Descriptions |
|---|---|---|
| Parity Latency (PL) | OP [3:2] | 00-0 CK_c cycles |
| | | 01-1 CK_c cycle |
| | | 10-2 CK_c cycles |
| | | 11-3 CK_c cycles |

Figure 4:
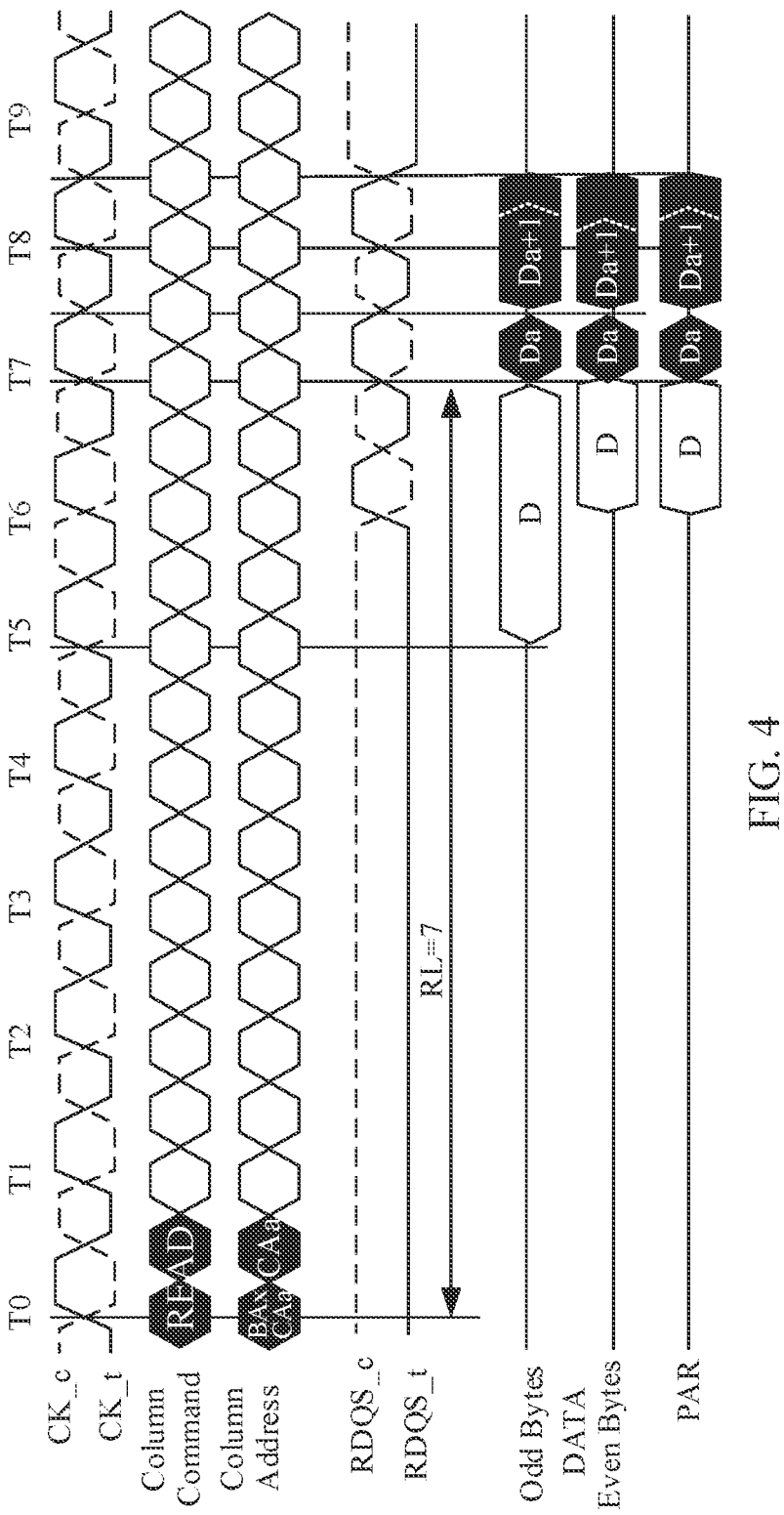
FIG. 4 is a schematic diagram of read data according to another embodiment.
Figure 5:
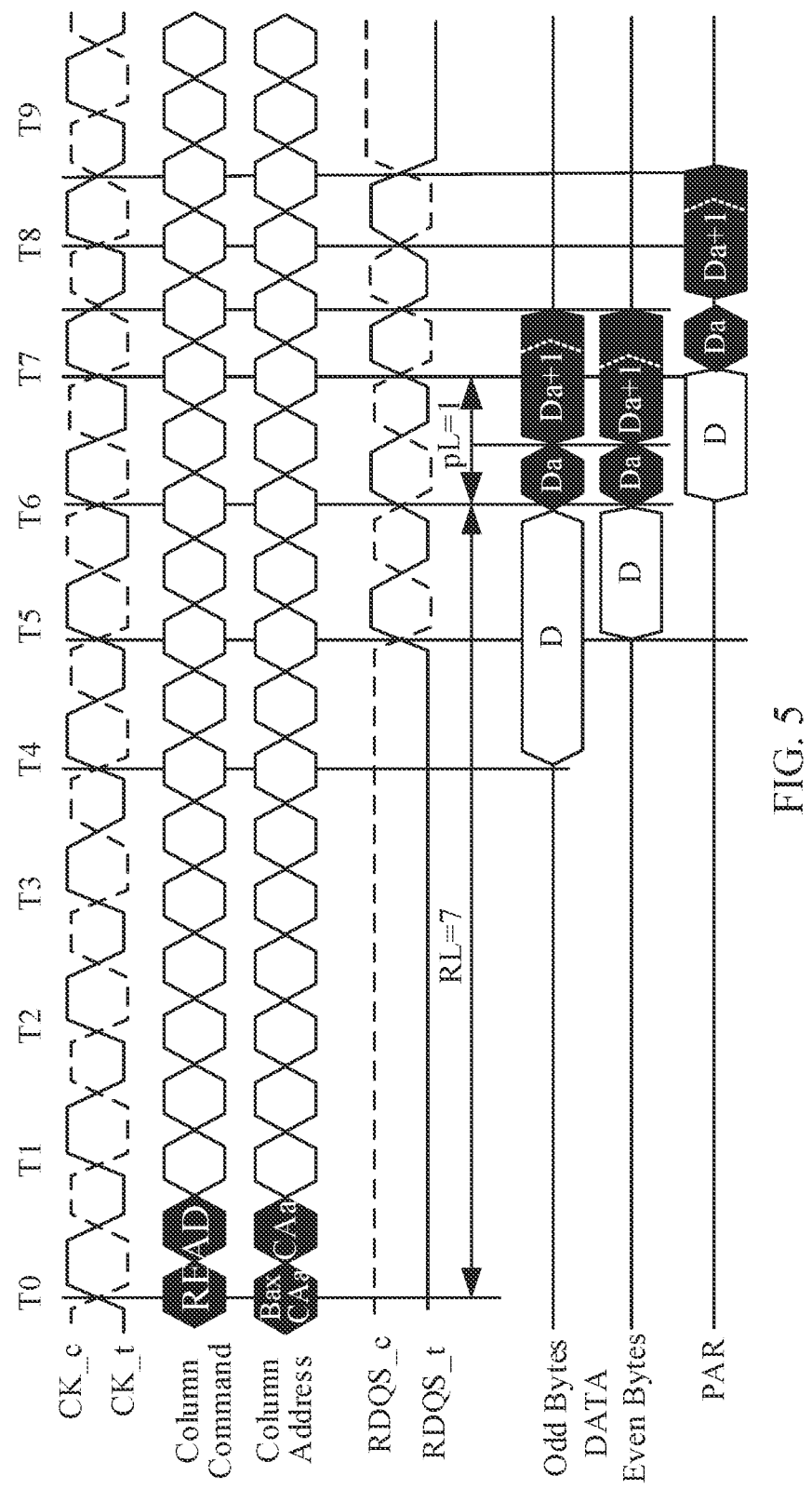
FIG. 5 is a schematic diagram of read data according to another embodiment.

The role of the PL parameter is illustrated by using examples. As shown in FIG. 4, correspondingly in this figure, read BL (Read burst length)=2, PL=0, and RL (Read Latency)=7, so that the read data signal arrives at the rising edge of a clock at a moment T7. Since PL=0, the parity check signal also arrives at the rising edge of the clock at the moment T7. Refer to FIG. 5. Correspondingly in this figure, read RL (Read burst length)=2, PL=1, and RL (Read Latency)=6, so that the read data signal arrives at the rising edge of a clock at a moment T6. Since PL=1, the parity check signal also arrives at the rising edge of the clock at the moment T7.

Figure 6:
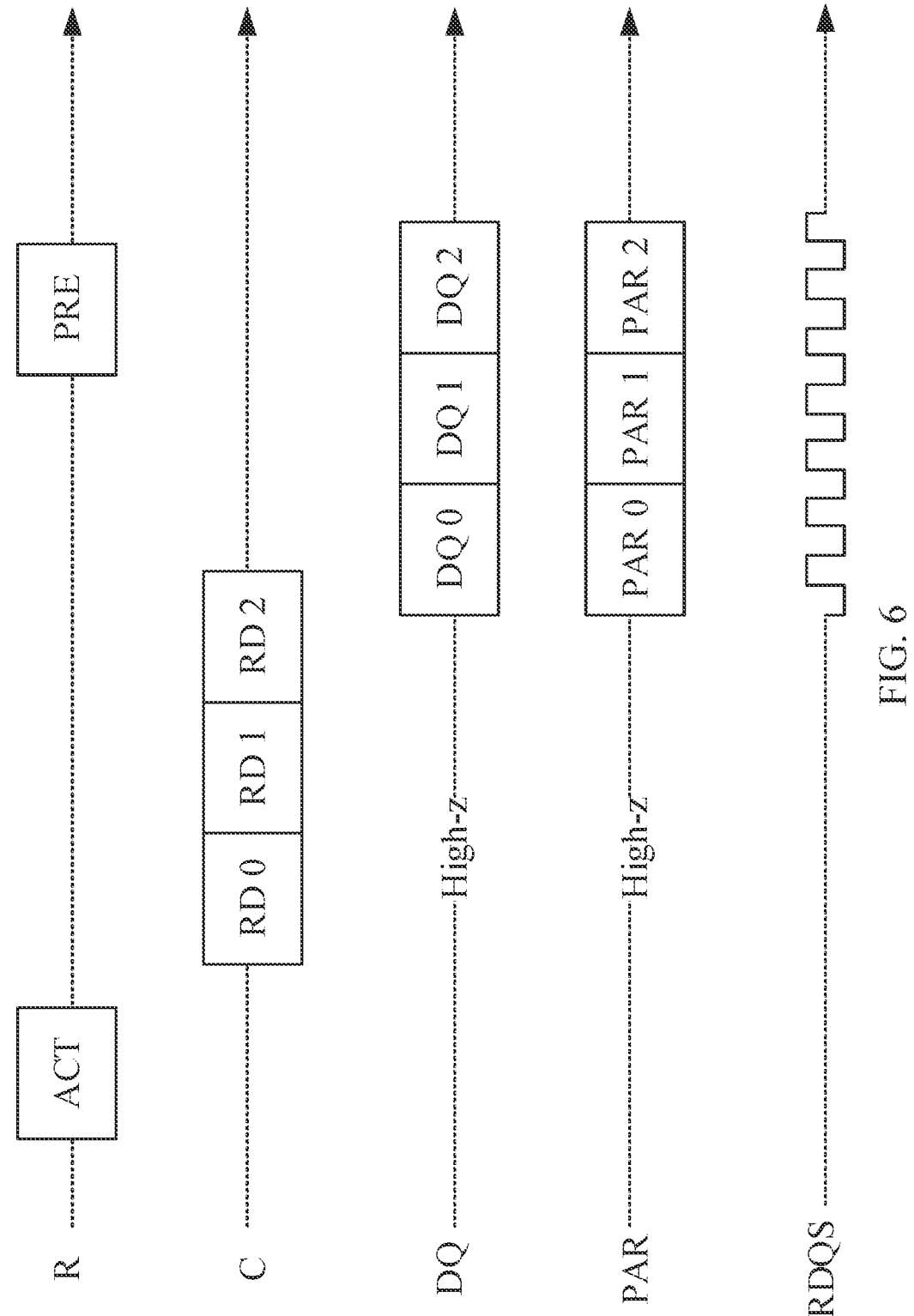
FIG. 6 is a schematic diagram of read data according to another embodiment.

From the foregoing descriptions, it can be seen that when the computer device transmits the data read instruction to the target memory, as shown in FIG. 6, the target memory replies the computer device with the read data signal (DQ), the parity check signal (PAR) of the read data signal, and the corresponding sampling pulse signal (RAQS). The computer device samples the read data signal and the parity check signal by using RDQS as a sampling signal to obtain the read data and the parity check data. Therefore, the sampling accuracy is highest only when a center of an eye diagram of the sampling pulse signal is aligned with that of the parity check signal. ACT is a row activation instruction, and PRE is a precharge instruction.

Figure 7:
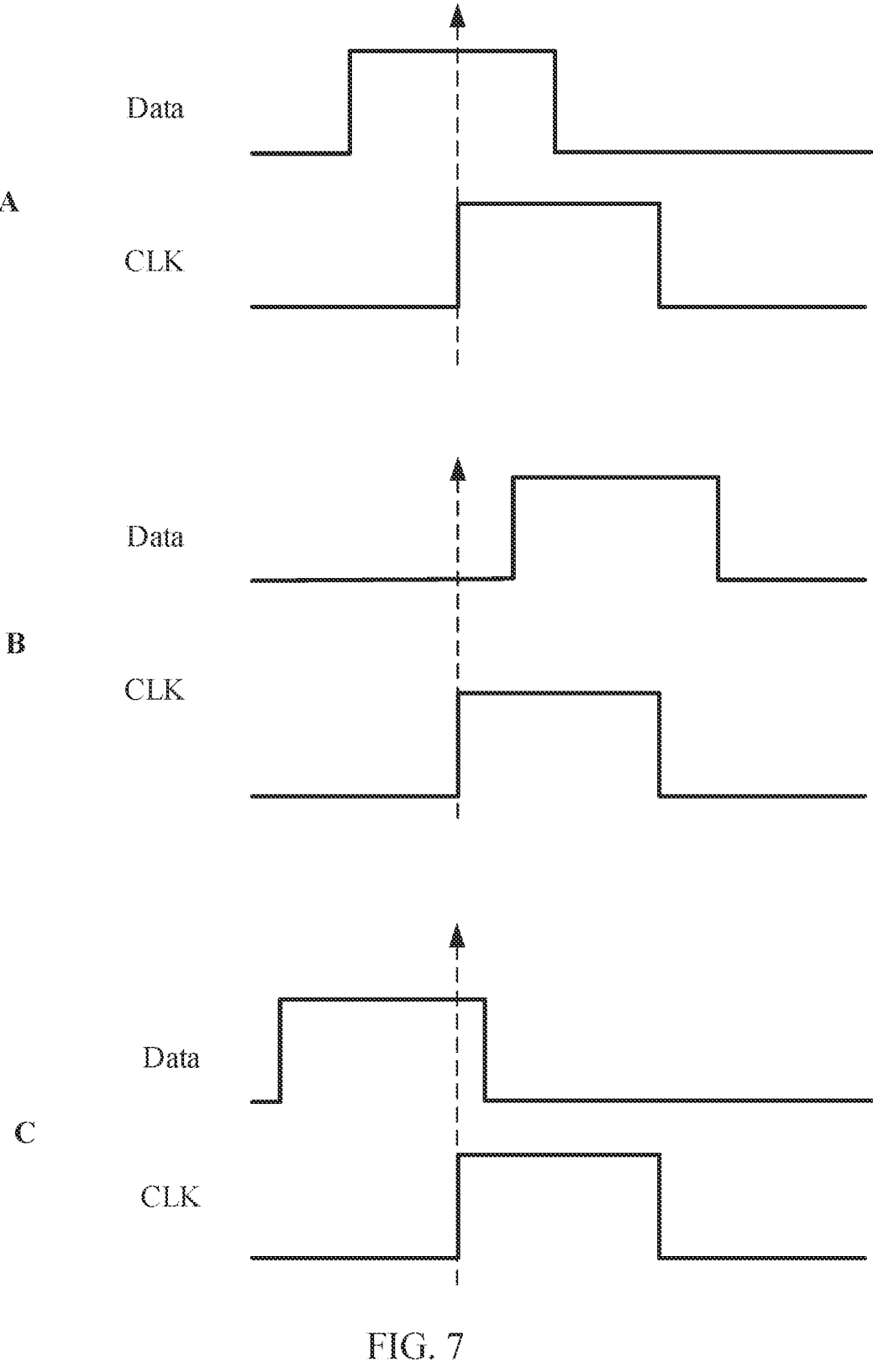
FIG. 7 is a schematic diagram of a data signal and a sampling pulse signal according to an embodiment.

The following describes the sampling accuracy by using examples. As shown in FIG. 7, in the figure, CLK is used to sample Data. In a scenario of HBM reading the check data, CLK is the RDQS signal returned by HBM DRAM, and Data includes the PAR data returned by HBM DRAM. In FIG. 7A, the rising edge of CLK (that is, a sampling edge) is located at a data center position of Data. In this case, the sampling accuracy is the highest. In FIG. 7B and FIG. 7C, the data center position of Data is not aligned with the rising edge of CLK. In FIG. 7B, the rising edge of CLK drifts out of a data window of Data. In FIG. 7C, although the rising edge of CLK does not drift out of the data window of Data, the sampling edge is excessively close to a data establishment (or cancellation) edge, causing a timing violation of a setup timing (or hold timing) in this sampling. Both situations shown in FIG. 7B and FIG. 7C lead to a sampling error of the read data.

In an embodiment, as shown in FIG. 8, a processing method for a check pin of a memory is provided. That the method is applied to the computer device (terminal or server) shown in FIG. 1 is used as an example for description. The method includes the following steps:

S802: Transmit a first data read instruction to a target memory.

The target memory may be a high bandwidth memory (HBM), and specifically, may be a HBM DRAM (Dynamic Random Access Memory). The first data read instruction is used for reading data from the target memory.

In this embodiment of this application, the transmitting a first data read instruction to a target memory is to initiate a read operation to the target memory. The read operation in this embodiment of this application is generally a burst read operation. Burst means a manner in which adjacent storage units in the same row of the target memory continuously transmit data. A quantity of cycles of continuous transmission is a burst length (BL for short).

Specifically, the computer device generates a first data read instruction and sends the first data read instruction to a target memory in a target mode. The target memory in the target mode reads the read data from a register unit of a target register based on the received data read instruction. FIG. 2 is a schematic diagram of a first data read instruction according to an embodiment of this application.

The target mode is one of operating modes of the memory. The operating mode of the memory may be set by using a mode register. The mode register is configured to define a specific operating mode of the HBM. The definition includes a burst length, a burst type, a CAS delay, and selection of an operating mode and a write burst mode. The operating mode in this embodiment of this application is specifically set by using a mode register bit MR7. For details, refer to function description information of the mode register bit MR7 shown in FIG. 9.

In an embodiment, before transmitting the first data read instruction to the target memory, the computer device further needs to configure the operating mode of the target memory. A process of configuring the operating mode of the target memory specifically includes the following steps: The computer device transmits an operating mode configuration instruction to the target memory to cause the target memory to configure a target mode based on the operating mode configuration instruction; and when the target memory is in the target mode, transmits the first data read instruction to the target memory in the target mode.

The target mode is a data word (DWORD) read linear feedback shift register (LFSR) mode.

Specifically, the computer device transmits the first data read instruction to the target memory in the data word read linear feedback shift register mode after configuring the target memory to the data word read linear feedback shift register (DWORD LFSR) mode. The target memory in the data word read linear feedback shift register mode may read the read data based on the received first data read instruction, and store the read data into a register unit of the target memory, so that the computer device can obtain the read data stored in the register unit.

In the foregoing embodiment, the computer device transmits the operating mode configuration instruction to the target memory to cause the target memory to configure the operating mode as the target mode based on the operating mode configuration instruction, so that the memory in the target mode can reply with the first data signal and the sampling pulse signal through each check pin, to further determine the sampling delay parameter of the check pin.

In an embodiment, a process of the target register configuring the operating mode as the target mode based on the operating mode configuration instruction includes the following steps: initialize a read instruction processing circuit of the target memory; and configure, based on the operating mode configuration instruction, an operating mode of the read instruction processing circuit as the target mode.

The operating mode configuration instruction includes 8 data bits, and different instructions are generated by changing values of different data bits. The instruction processing circuit may be a multiple-input shift register (MISR) circuit.

The multiple-input shift register (MISR) circuit may include a plurality of triggers and a plurality of input selectors alternately coupled in series, and the plurality of input selectors may respectively correspond to the plurality of triggers. FIG. 10 is a schematic diagram of a MISR circuit according to an embodiment. The figure shows a case in which 4 triggers and 4 input selectors are used to store and output 4 data bits. Refer to FIG. 10. When input control signals M0 and M1 are both 1, that is, when the input control signals M0 and M1 are both input at a logic high level, the MISR circuit corresponds to a multi-input shift register mode (MISR mode), that is, the MISR circuit may perform a function of the multi-input shift register. When an input control signal M0 bit is 0 and an input control signal M1 bit is 1, that is, when the input control signal M0 is input at a logic low level and the input control signal M1 is input at a logic high level, the MISR circuit corresponds to a simple register mode, that is, the MISR circuit may perform a simple register function. When the input control signal M0 bit is 1 and the input control signal M1 bit is 0, that is, when the input control signal M0 is input at a logic high level and the input control signal M1 is input at a logic low level, the MISR circuit corresponds to the linear feedback shift register mode (LFSR mode), that is, the MISR circuit may perform a linear feedback shift register mode (LFSR) function.

It may be understood that when the instruction processing circuit supports 20 data bits, the corresponding MISR circuit may include 20 triggers and 20 input selectors to store and output 20 data bits. The 20-bit MISR circuit may be described mathematically using the following polynomial:

$$f(X) = X^{20} + X^{17} + 1$$

When the instruction processing circuit supports 4 data bits, the corresponding MISR circuit may include 4 triggers and 4 input selectors to store and output 4 data bits. The 4-bit MISR circuit may be described mathematically using the following polynomial:

$$f(X) = X^4 + X^3 + 1$$

Specifically, the computer device generates an initialization instruction and transmits the initialization instruction to the target memory. After receiving the initialization instruction, the target memory initializes the read instruction processing circuit based on the initialization instruction. The computer device then transmits the operating mode configuration instruction to the target memory. The initialized target memory configures the operating mode of the read instruction processing circuit of the target memory to the target mode based on the operating mode configuration instruction.

For example, HBM configures the DWORD MISR circuit to a DWORD read LFSR mode, which is specifically completed by configuring the mode register MR7 of HBM. The steps of configuring HBM to the DWORD read LFSR mode are as follows: First, an instruction value of MR7 is configured to 8'b00000001. Refer to FIG. 9. OP0 is 1, which means that a DWORD Loopback mode is enabled. OP[5:3] is 3'b000, which means that a default value in the DWORD register is reset to 0xAAAAAh. The remaining bits are all default values, so that the read instruction processing circuit is initialized based on the MR7 instruction. Then the instruction value of MR7 is configured to 8'b00001011. OP0 is 1, which means that the DWORD Loopback mode is enabled, and OP[2:1] is 2'b01, which means that the value in the MISR register is read. Since the value is reset during the initialization process, the value read is 0xAAAAAh. OP[5:3] is 3'b001, the DWORD register is configured to read LFSR mode, and the remaining bits are all default values, so that the operating mode of the read instruction processing circuit configured for the target memory based on the MR7 instruction is the DWORD read LFSR mode.

In the foregoing embodiment, the read instruction processing circuit of the target memory is initialized, and the operating mode of the read instruction processing circuit is configured to the target mode based on the operating mode configuration instruction, so that the target memory in the target mode can reply with the first data signal and the sampling pulse signal through each check pin, to further determine the sampling delay parameter of the check pin.

S804: Receive a first data signal and a sampling pulse signal returned by each check pin in the target memory.

The first data signal is generated based on the target data bit in the read data, and the read data is data read by the target memory from a register of the target memory based on the first data read instruction.

The operating mode of the target memory is the target mode. In the target mode, the data output by each check pin no longer represents check data of the read data, but the corresponding check pin is replied with a value of a target data bit in read data that is close to each pin.

Specifically, after receiving the first data read instruction, the target memory performs a read operation based on the first data read instruction to obtain the read data, replies the corresponding check pin with the value of the target data bit in the read data, and outputs the value of the target data bit as the first data signal through the check pin.

For example, single-channel read data and a parity check pin of a HBM DRAM include the following related interfaces:

TABLE 2

| Function | Data bit width | Function description |
|---|---|---|
| DQ | 128 bits | HBM DRAM read data bus |
| DBI | 16 bits | Data Bus Inversion |
| PAR | 4 bits | Read parity check data |

For example, in the DWORD read LFSR mode, the data returned by the check pin no longer truly represents the content of the check data of the read data, and is not affected by the corresponding settings of the DQ bus read parity check in MR0. Function description information of the mode register bit MR0 is shown in FIG. 11. In the DWORD read LFSR mode, the HBM DRAM may reply the corresponding check pin with the target data bit in the read data (DQ) that is close to each check pin. The following table shows the data bit of the read data returned by each parity (PAR) pin:

TABLE 3

| PAR pin bit | Related DQ data bit |
|---|---|
| PAR [0] | DQ [2] |
| PAR [1] | DQ [34] |
| PAR [2] | DQ [66] |
| PAR [3] | DQ [98] |

In the read LFSR mode, PAR[0] no longer represents parity check data of 32-bit data DQ[31:0], but PAR[0] is only replied with a value of DQ[2]. Similarly, PAR[1] is replied with a value of DQ[34], PAR[2] is replied with a value of DQ[66], and PAR[3] is replied with a value of DQ[98]. In addition, the configuration content of PL no longer takes effect, and PAR and DQ arrives at the same time, that is, the reply delay is a value used when PL=0.

Figure 12:
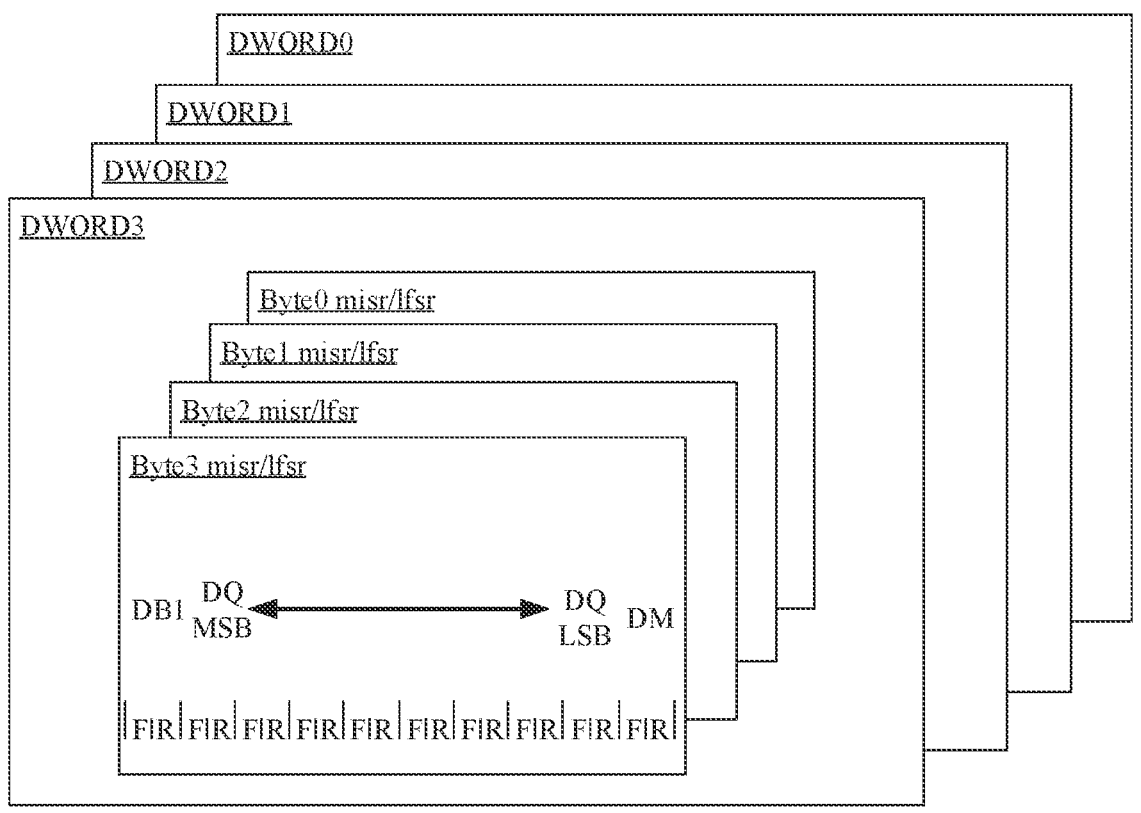
FIG. 12 is a schematic diagram of a structure of read data according to an embodiment.

Refer to a schematic diagram of a structure of read data shown in FIG. 12. In this embodiment of this application, a complete data word (DWORD) may be divided into four groups: DWORD0, DWORD1, DWORD2, and DWORD3, where each DWORD is further divided into 4 data units: Byte0, Byte1, Byte2, and Byte3, which means that 128-bit read data (DQ) is distributed in 16 Bytes, and each Byte includes 8-bit DQ. As shown in FIG. 12, the $19^{th}$ bit to the $0^{th}$ bit in each Byte are a falling edge data word of DBI and a rising edge data word of DBI, a falling edge data word and a rising edge data word of each bit in the 8-bit DQ, and a falling edge data word of DM and a rising edge data word of DBI. In other words, each Byte includes a 20-bit value, and when the DWORD register is reset, the value may become 0xAAAAAh. Therefore, an initial value of each check pin is as shown in the following table:

TABLE 4

| PAR pin bit | Related DQ data bit | PAR initial value |
|---|---|---|
| PAR [0] | DQ [2] | 1'b0 |
| PAR [1] | DQ [34] | 1'b0 |
| PAR [2] | DQ [66] | 1'b0 |
| PAR [3] | DQ [98] | 1'b0 |

It may be understood that a quantity of check pins is the same as a quantity of first data signals. For example, when there are 4 check pins, correspondingly, there are also 4 corresponding first data signals. For example, when the check pins are PAR[0], PAR[1], PAR[2], and PAR[3], the read data are data1, data2, data3, and data4, the first data signals returned by PAR[0] are generated based on values of the DQ[2] data bit in data1, data2, data3, and data4 respectively, the first data signals returned by PAR[1] are generated based on values of the DQ[34] data bit in data1, data2, data3, and data4 respectively, the first data signals returned by PAR[2] are generated based on values of the DQ[66] data bit in data1, data2, data3, and data4 respectively, and the first data signals returned by PAR[3] are generated based on values of the DQ[98] data bit in data1, data2, data3, and data4 respectively.

S806: Time-shift each first data signal through a delay circuit to align a target level value in each first data signal after the time shift with the sampling pulse signal to obtain a first delay parameter.

Each check pin corresponds to a corresponding delay circuit. The delay circuit is configured to time-shift the data signal returned by the corresponding check pin. Time-shifting means moving the data signal in time, and specifically, the data signal may be time-shifted by adjusting a time delay on a corresponding transmission path of each data signal. Directions of time shift specifically include a first direction and a second direction, where the first direction is a direction in which time is delayed, and the second direction is a direction in which time is advanced.

The target level value may be a first high level of the first data signal, and alignment of the target level value with the sampling pulse signal means that the first high level of the first data signal is aligned with the rising edge of the sampling pulse signal. The alignment of the first high level of the first data signal and the rising edge of the sampling pulse signal may specifically include at least one of the following: alignment of a rising edge of the first high level of the first data signal and the rising edge of the sampling pulse signal, alignment of a falling edge of the first high level of the first data signal with the rising edge of the sampling pulse signal, and alignment of an eye diagram center of the first high level of the first data signal with the rising edge of the sampling pulse signal.

The first delay parameter is delay time that aligns the eye diagram center of the first high level in the first data signal after the time shift with the sampling pulse signal. In other words, when the first data signal is time-shifted based on the first delay parameter, the eye diagram center of the first high level in the first data signal after the time shift is aligned with the rising edge of the sampling pulse signal.

Refer to FIG. 7. It is assumed that Data in FIG. 7C is a first data signal received by a specific check pin, and an eye diagram center of the first high level of the first data signal is on the left side of the rising edge of the sampling pulse signal (CLK). The first data signal is time-shifted in the first direction based on the first delay parameter through the delay circuit corresponding to the check pin, so that the eye diagram center of the first high level of the first data signal after the time shift shown in FIG. 7A can be aligned with the rising edge of the sampling pulse signal (CLK).

Figure 13:
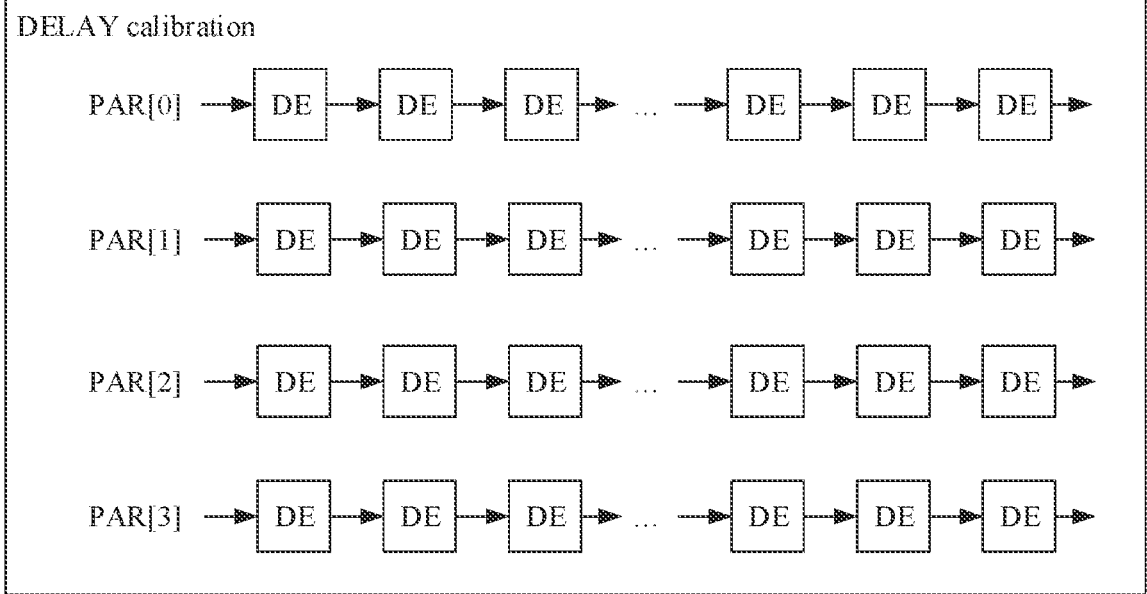
FIG. 13 is a schematic diagram of a delay circuit according to an embodiment.
Figures 14, 15:
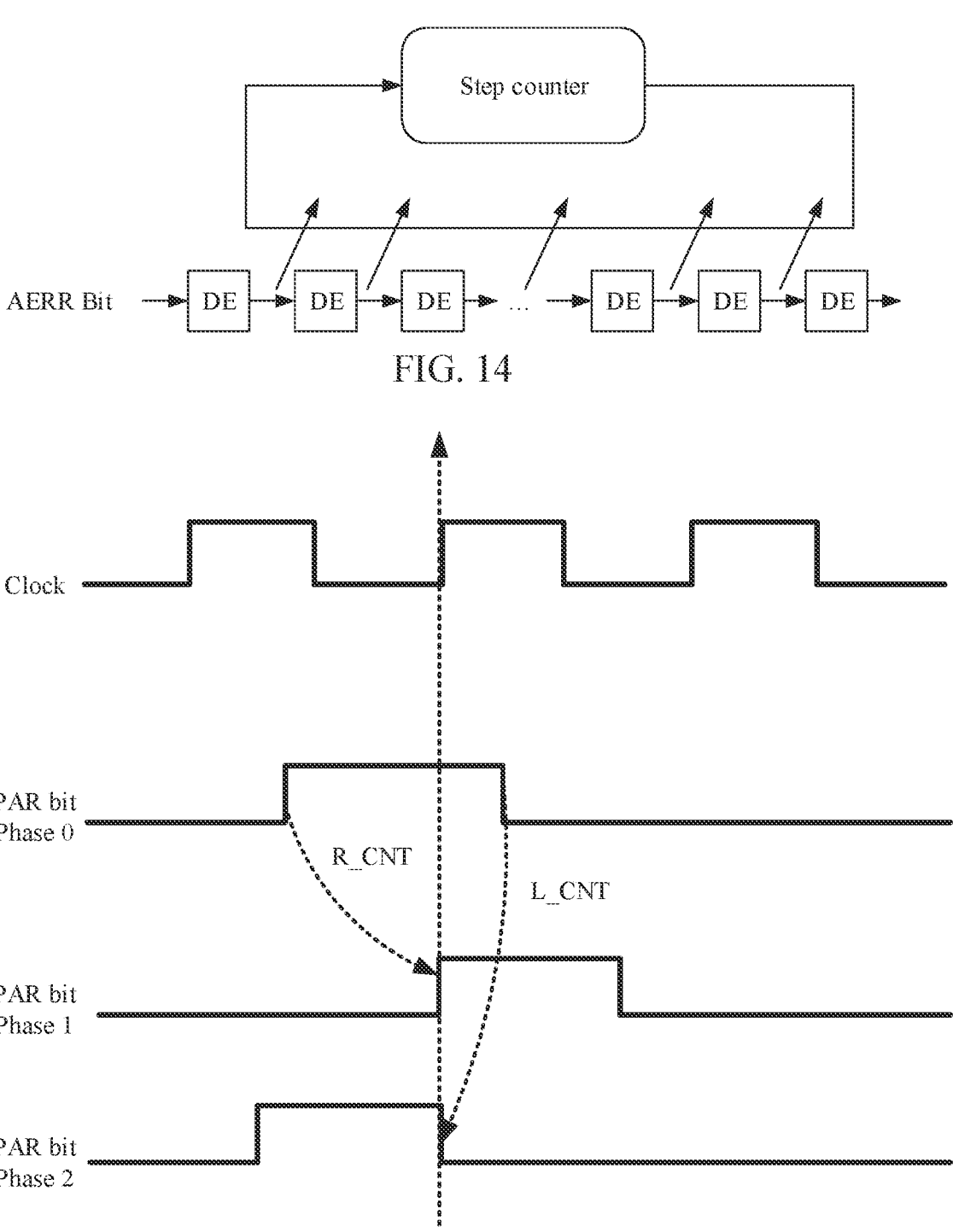
FIG. 14 is a schematic diagram of a delay circuit according to another embodiment.
FIG. 15 is a schematic diagram of a time shift effect of a digital signal according to an embodiment.

As shown in FIG. 13, which is a schematic diagram of a delay circuit according to an embodiment, the delay circuit corresponding to each check pin includes a plurality of delay elements (DEs). Each delay element includes 4 inverter (inverter) circuits, and each DE includes a tap interface. As shown in FIG. 14, a step counter (step counter) may control the data signal to be taken out from a specific tap outlet to time shift the data signal, where a time difference between two adjacent tap outlets is 1 time shift step. For example, in an initial state, the first data signal of a specific check pin is received from an $i^{th}$ tap outlet of the delay circuit. In other words, in a default state, the computer device receives the first data signal from the $i^{th}$ tap outlet of the delay circuit. When the first data signal needs to be time-shifted in the first direction, the computer device may receive the first data signal from a tap outlet after an $(i+1)^{th}$ tap outlet, thereby time-shifting the first data signal in the first direction; and when the first data signal needs to be time-shifted in the second direction, the computer device may receive the first data signal from a tap outlet after an $(i-1)^{th}$ tap outlet, thereby time-shifting the first data signal in the second direction.

In an embodiment, S806 specifically includes the following steps: time-shift each first data signal along a first direction through the delay circuit to align a rising edge of the target level value in each first data signal after the time shift with a rising edge of the sampling pulse signal to obtain a first time shift parameter; time-shift each first data signal along a second direction through the delay circuit to align a falling edge of the target level value in each first data signal after the time shift with the rising edge of the sampling pulse signal to obtain a second time shift parameter, where the first direction and the second direction are opposite directions; and determine the first delay parameter corresponding to each check pin based on the first time shift parameter and the second time shift parameter.

For time-shifting each first data signal along the first direction, a specific process is as follows. After obtaining the first data signal, the computer device sets a corresponding time shift length of each check pin, and returns to perform the step of transmitting a first data read instruction to a target memory. After the first data signal re-returned by each check pin is received, the first data signal is time-shifted based on the set time shift length, and whether the rising edge of the target level value in the first data signal after the time shift is aligned with the sampling pulse signal is determined. If the rising edge of the target level value in the first data signal corresponding to each check pin is aligned with the sampling pulse signal, the corresponding set time shift length of each check pin and the first direction are determined as the first time shift parameter corresponding to each check pin. If the rising edge of the target level value in the corresponding first data signal of at least one check pin of check pins is not aligned with the sampling pulse signal, the corresponding time shift length of each check pin is reset, and the step of transmitting a first data read instruction to a target memory is returned and performed until the rising edge of the target level value in the first data signal corresponding to each check pin is aligned with the sampling pulse signal, and the time shift length corresponding to each check pin during alignment and the first direction are determined as the first time shift parameter of the corresponding check pin.

Taking one of the check pins as an example, referring to FIG. 15, a data signal corresponding to phase 0 is the first data signal received by the computer device through the $i^{th}$ (initial default) tap outlet of the delay circuit. That is to say, the data signal corresponding to phase 0 is a first data signal without the time shift. After receiving the first data signal, the computer device sets the time shift direction of the check pin as the first direction through the delay circuit shown in FIG. 14, and the time shift length is n time shift steps, that is to say, the first data signal is received through an $(i+n)^{th}$ tap outlet, where n is the number of time shifts, and the step of transmitting a first data read instruction to a target memory is returned and performed. After the first data signal re-returned by each check pin is received, the first data signal is received through the $(i+n)^{th}$ tap outlet, the first data signal after the time shift is obtained, whether the rising edge of the target level value of the first data signal after the time shift is aligned with the sampling pulse signal is determined, and the time shift length corresponding to the check pin during alignment and the first direction are determined as the first time shift parameter of the check pin. As shown in FIG. 15, the data signal corresponding to phase 1 is a first data signal after the time shift after several time shifts.

For time-shifting each first data signal along the second direction, a specific process is as follows. After obtaining the first data signal, the computer device sets a corresponding time shift length of each check pin, and returns to perform the step of transmitting a first data read instruction to a target memory. After the first data signal re-returned by each check pin is received, the first data signal is time-shifted based on the set time shift length, and whether the falling edge of the target level value in the first data signal after the time shift is aligned with the sampling pulse signal is determined. If the falling edge of the target level value in the first data signal corresponding to each check pin is aligned with the sampling pulse signal, the corresponding set time shift length and the second direction of each check pin are determined as the second time shift parameter corresponding to each check pin. If the falling edge of the target level value in the corresponding first data signal of at least one check pin of check pins is not aligned with the sampling pulse signal, the corresponding time shift length of the at least one check pin is reset, and the step of transmitting a first data read instruction to a target memory is returned and performed until the falling edge of the target level value in the first data signal corresponding to each check pin is aligned with the sampling pulse signal, and the time shift length corresponding to each check pin during alignment and the second direction are determined as the second time shift parameter of the corresponding check pin.

Taking one of the check pins as an example, referring to FIG. 15, a data signal corresponding to phase 0 is the first data signal received by the computer device through the $i^{th}$ (initial default) tap outlet of the delay circuit. That is to say, the data signal corresponding to phase 0 is a first data signal without the time shift. After receiving the first data signal, the computer device sets the time shift direction of the check pin as the second direction through the delay circuit shown in FIG. 14, and the time shift length is n time shift steps, that is to say, the first data signal is received through an $(i-n)^{th}$ tap outlet, where n is the number of time shifts, and the step of transmitting a first data read instruction to a target memory is returned and performed. After the first data signal re-returned by each check pin is received, the first data signal is received through the $(i-n)^{th}$ tap outlet, the first data signal after the time shift is obtained, whether the falling edge of the target level value of the first data signal after the time shift is aligned with the sampling pulse signal is determined, and the time shift length corresponding to the check pin during alignment is determined as the second time shift parameter of the check pin. As shown in FIG. 15, the data signal corresponding to phase 2 is a first data signal after the time shift after several time shifts.

In an embodiment, after obtaining the first time shift parameter and the second time shift parameter of any check pin, the computer device inputs the first time shift parameter and the second time shift parameter into the following formula, thereby determining the first delay parameter of the check pin:

$$V_{CNT} = \frac{R_{CNT} + L_{CNT}}{2}$$

$V_{CNT}$ indicates the first delay parameter, $R_{CNT}$ indicates the first time shift parameter, and $L_{CNT}$ indicates the second time shift parameter.

In the foregoing embodiment, the computer device time-shifts each first data signal along a first direction through the delay circuit to align a rising edge of the target level value in each first data signal after the time shift with a rising edge of the sampling pulse signal to obtain a first time shift parameter; time-shifts each first data signal along a second direction through the delay circuit to align a falling edge of the target level value in each first data signal after the time shift with the rising edge of the sampling pulse signal to obtain a second time shift parameter, where the first direction and the second direction are opposite directions; and determines, based on the first time shift parameter and the second time shift parameter, the first delay parameter corresponding to each check pin, so that after the data signal returned by each check pin is subsequently received, that is, the parity check signal is received, the parity check signal may be time-shifted based on the determined first delay parameter, so that the parity check signal after the time shift is aligned with the rising edge of the sampling pulse signal to further determine the second delay parameter.

S808: In a case of receiving a second data signal returned by each check pin in the target memory, time-shifts a target data signal in each second data signal through the delay circuit to align target level values in all second data signals after the time shift to obtain a second delay parameter.

In an embodiment, after time-shifting each first data signal through the delay circuit to align the target level value in each first data signal after the time shift with the sampling pulse signal, the computer device may further transmit the second data read instruction to the target memory; and receives a second data signal and a sampling pulse signal returned by each check pin in the target memory.

The second data read instruction may be the same as the first data read instruction, or may be different from the second data read instruction. The second data signal is generated based on the target data bit in the read data, and the read data is data read by the target memory from a register of the target memory based on the second data read instruction.

The operating mode of the target memory is the target mode. In the target mode, the data output by each check pin no longer represents check data of the read data, but the corresponding check pin is replied with a value of a target data bit in read data that is close to each pin.

Specifically, after receiving the second data read instruction, the target memory performs a read operation based on the second data read instruction to obtain the read data, returns the value of the target data bit in the read data to the corresponding check pin, and outputs the value of the target data bit as the second data signal through the check pin.

In an embodiment, after obtaining the second data signal, the computer device may further sample, based on the sampling pulse signal, the second data signal after the time shift based on the first delay parameter to obtain fourth sampling data. A process of the computer device time-shifting a target data signal in each second data signal through the delay circuit to align a target level value in each second data signal after the time shift to obtain a second delay parameter specifically includes the following steps: when a target data bit of target sampling data in the fourth sampling data is different from target data bits of other fourth sampling data, determine that the target data signal in the second data signal is not aligned with other target level values in the second data signal; and time-shift the target data signal in the second data signal through the delay circuit to align the target level value in each second data signal after the time shift to obtain the second delay parameter.

Specifically, after obtaining the second data signal, the computer device initially time-shifts the second data signal based on the first delay parameter through the delay circuit to obtain a second data signal after the initial time shift, and samples the second data signal after the initial time shift based on the sampling pulse signal to obtain fourth sampling data, searches the target sampling data whose target data bit in each piece of fourth sampling data is different from the target data bits of other fourth sampling data, determines that the second data signal after the initial time shift corresponding to the target sampling data is not aligned with the second data signal among other initial data signals, and modifies and time-shifts the target data signal in the second data signal after the initial time shift through the delay circuit, so that the target level value in each second data signal after the time shift is aligned, and the time shift length of the target data signal in a time shift modification process is determined as the second delay parameter.

Figure 16:
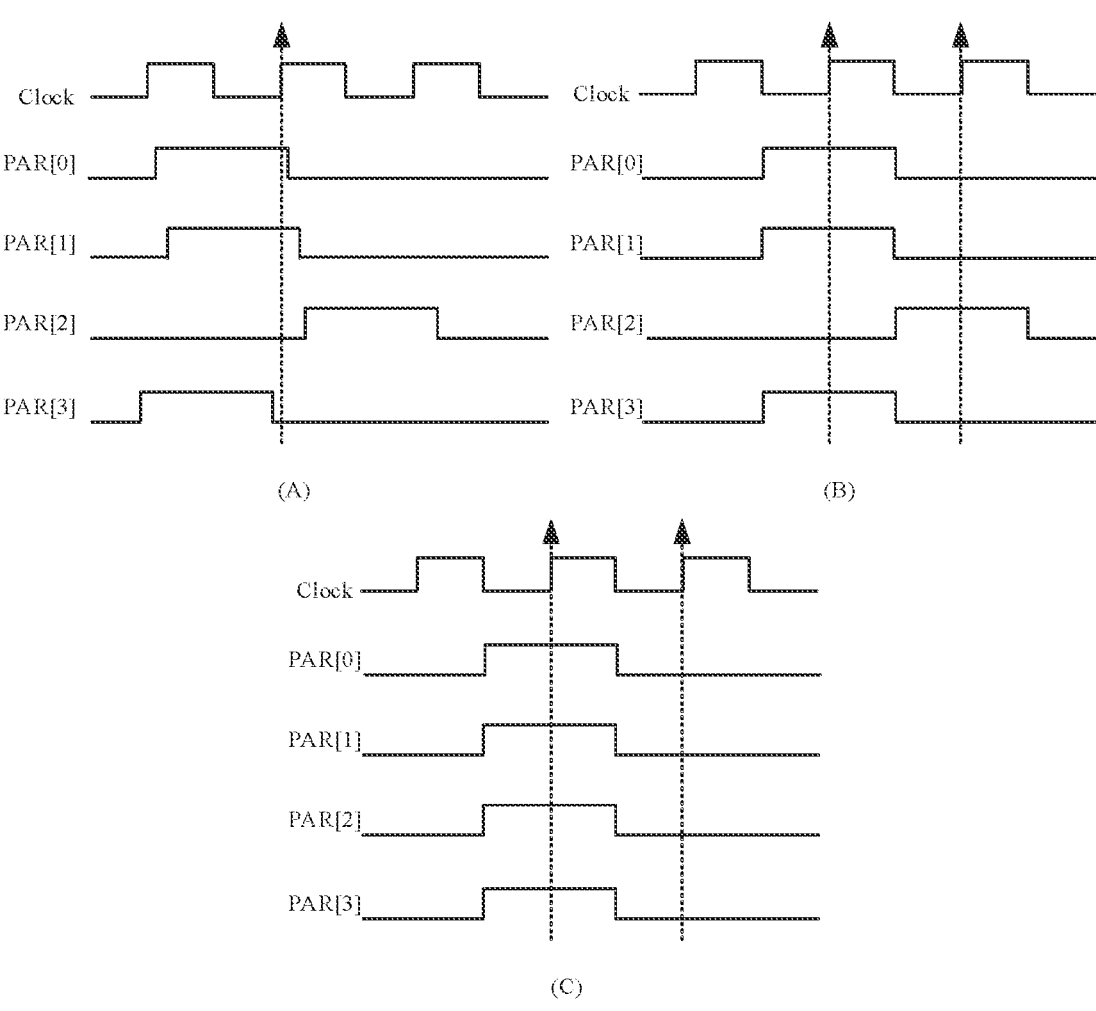
FIG. 16 is a schematic diagram of a time shift effect of a digital signal according to another embodiment.

After the computer device initially time-shifts the second data signal corresponding to each check pin through the delay circuit based on the first delay parameter, the eye diagram center of the target level value of the second data signal after the initial time shift corresponds to the rising edge of the sampling pulse signal, but the corresponding rising edge of the sampling pulse signal may be a rising edge in the same clock cycle, or may be a rising edge in different cycles. As shown in FIG. 16A, which shows the second data signals respectively corresponding to the four PAR pins: PAR[0] to PAR[3]. After the second data signals are initially time-shifted based on the first delay parameter corresponding to each PAR pin, a result shown in FIG. 16B is obtained. As can be seen from FIG. 16B, the eye diagram centers of the target level values of the second data signals after the initial time shift of PAR[0], PAR[1], and PAR[3] are aligned with the rising edge of a second clock cycle, and the eye diagram center of the target level value of the second data signal after the initial time shift of PAR[2] is aligned with the rising edge of a third clock cycle. After the second data signal after the initial time shift of each PAR[0], PAR[1], and PAR[3] is sampled to obtain the fourth sampling data, the target data bits of PAR[0], PAR[1], and PAR[3] are all the first bit, and the target data bit of the fourth sampling data of PAR[2] is the second bit. Then the fourth sampling data of PAR[2] is determined as the target sampling data, and the second data signal after the initial time shift corresponding to the fourth sampling data of PAR[2] is determined as a target second data signal, so that the second data signal after the initial time shift of PAR[2] is modified and time-shifted through the delay circuit until the obtained target level value in the second data signal after the modified time shift of PAR[2] is aligned with the target level values of the second data signals after the initial time shift of PAR[0], PAR[1], and PAR[3] (as shown in FIG. 16C), and the time shift length and direction of the modified time shift corresponding to the second data signal after the modified time shift of PAR[2] during alignment is determined as the second delay parameter of PAR[2]. For PAR[0], PAR[1], and PAR[3] that do not undergo modified time shift, the second delay parameter may be determined as 0.

In an embodiment, after obtaining the second data signal, the computer device initially time-shifts the second data signal based on the first delay parameter through the delay circuit to obtain a second data signal after the initial time shift, and samples the second data signal after the initial time shift based on the sampling pulse signal to obtain fourth sampling data. If the target data bits of each piece of fourth sampling data are the same, it is determined that the target level values of the second data signals after initial time shift corresponding to each fourth sampling data are aligned, and then the second delay parameter corresponding to each check pin is determined as 0.

In the foregoing embodiment, the computer device may further sample, based on the sampling pulse signal, the second data signal after the time shift based on the first delay parameter to obtain the fourth sampling data; and when a target data bit of target sampling data in the fourth sampling data is different from target data bits of other fourth sampling data, determine that the target data signal in the second data signal is not aligned with other target level values in the second data signal. The target data signals in the second data signals are respectively time-shifted through the delay circuit, to align the target level values in each second data signal after the time shift to obtain the second delay parameter, so that the sampling delay parameter of each check pin may be determined based on the second delay parameter, and after the data signal returned by each check pin is subsequently received, that is, the parity check signal is received, the parity check signal may be time-shifted based on the determined sampling delay parameter, and the parity check signal after the time shift is aligned with the sampling pulse signal to ensure the correctness when the parity check signal is sampled based on the sampling pulse signal.

S810: Determine a sampling delay parameter of the check pin based on the first delay parameter and the second delay parameter.

Specifically, after obtaining the first delay parameter and the second delay parameter corresponding to each check pin, the computer device calculates a sum of the corresponding first delay parameter and the second delay parameter, and determines the obtained sum as the sampling delay parameter of the corresponding check pin, so that after the data signal returned by each check pin is subsequently received, that is, the parity check signal is received, the parity check signal may be time-shifted based on the determined sampling delay parameter, and the parity check signal after the time shift is aligned with the sampling pulse signal to ensure the correctness when the parity check signal is sampled based on the sampling pulse signal.

In the foregoing embodiment, the computer device transmits a first data read instruction to a target memory; receives a first data signal and a sampling pulse signal returned by each check pin in the target memory; time-shifts each first data signal through a delay circuit to align a target level value in each first data signal after the time shift with the sampling pulse signal to obtain a first delay parameter; when receiving a second data signal returned by each check pin in the target memory, time-shifts a target data signal in each second data signal through the delay circuit to align target level values in all second data signals after the time shift to obtain a second delay parameter; and determines a sampling delay parameter of the check pin based on the first delay parameter and the second delay parameter, so that after the data signal returned by each check pin is subsequently received, that is, the parity check signal is received, the parity check signal may be time-shifted based on the determined sampling delay parameter, and the parity check signal after the time shift is aligned with the sampling pulse signal to ensure the correctness when the parity check signal is sampled based on the sampling pulse signal.

In an embodiment, a process in which after obtaining the first data signal, the computer device samples the first data signal based on the sampling pulse signal to obtain the first sampling data, and the computer device time-shifts each first data signal along a first direction through the delay circuit to align a rising edge of the target level value in each first data signal after the time shift with a rising edge of the sampling pulse signal to obtain a first time shift parameter specifically includes the following steps: time-shift each first data signal along the first direction through the delay circuit; sample a first data signal after the time shift along the first direction based on the sampling pulse signal to obtain second sampling data; when a value of a target data bit in each piece of the second sampling data is the same as a target value corresponding to a target data bit in the first sampling data, determine that the rising edge of the target level value in each first data signal after the time shift is aligned with the rising edge of the sampling pulse signal; and determine a time shift length corresponding to each piece of the second sampling data as the first time shift parameter.

After obtaining the first data signal, the computer device samples the first data signal based on the sampling pulse signal to obtain the first sampling data, and the value of the data bit corresponding to the target level value of the first data signal in the obtained first sampling data is to be is 1. When the rising edge of the target level value in each first data signal after the time shift is aligned with the rising edge of the sampling pulse signal, that is, when the rising edge of the first high level in each first data signal after the time shift is aligned with the rising edge of the sampling pulse signal, a value of the corresponding bit data bit obtained by sampling the first data signal after the time shift based on the sampling pulse signal is to be 0. As shown in FIG. 15, the data signal corresponding to phase 0 is the first data signal without the time shift, and the value of the first bit data bit in the first sampling data obtained by sampling the first data signal based on the sampling pulse signal is to be 1. The data signal corresponding to phase1 is the first data signal after the time shift, and the value of the first bit data bit in the first sampling data obtained by sampling the first data signal after the time shift based on the sampling pulse signal is to be 0.

Based on this, in this embodiment of this application, the data bit corresponding to the target level value of the first data signal in the first sampling data is determined as the target data bit, and the target value corresponding to the target data bit in the first sampling data is set to 0.

Specifically, after obtaining each first data signal, the computer device samples the first data signal at the rising edge of the sampling pulse signal to obtain each piece of first sampling data, returns to perform the step of transmitting a first data read instruction to a target memory, time-shifts each first data signal along the first direction through the delay circuit to obtain each first data signal after the time shift, samples each first data signal after the time shift at the rising edge of the sampling pulse signal to obtain each piece of second sampling data, and determines whether the value of the target data bit in each piece of second sampling data is the same as the target value corresponding to the target data bit in the corresponding first sampling data. When the value of the target data bit in the second sampling data is the same as the target value corresponding to the target data bit in the corresponding first sampling data, it is determined that the rising edge of the target level value in each first data signal after the time shift is aligned with the rising edge of the sampling pulse signal, and the time shift length of the first data signal after the time shift corresponding to the second sampling data and the first direction are determined as the first time shift parameter.

For example, the target data in the first sampling data obtained by sampling the first data signal of a specific check pin is the $2^{nd}$ bit data bit, a value of the $2^{nd}$ bit data bit is 1, and the corresponding target value is 0, so that after the first data signal after the time shift obtained by time-shifting along the first direction is sampled to obtain the second sampling data, the value of the $2^{nd}$ bit data bit in the second sampling data is obtained. If the value of the $2^{nd}$ bit data bit in the second sampling data is 0, it is determined that the rising edge of the target level value of the first data signal after the time shift along the first direction is aligned with the rising edge of the sampling pulse signal, and the time shift length of the first data signal after the time shift along the first direction and the first direction are determined as the first time shift parameter.

In the foregoing embodiment, the computer device samples the first data signal based on the sampling pulse signal to obtain the first sampling data; time-shifts each first data signal along the first direction through the delay circuit; samples a first data signal after the time shift along the first direction based on the sampling pulse signal to obtain second sampling data; when a value of a target data bit in each piece of the second sampling data is the same as a target value corresponding to a target data bit in the first sampling data, determines that the rising edge of the target level value in each first data signal after the time shift is aligned with the rising edge of the sampling pulse signal; and determines the time shift length corresponding to each piece of second sampling data as the first time shift parameter, so that a sampling delay parameter of the check pin may be determined based on the first time shift parameter, and after the data signal returned by each check pin is subsequently received, that is, the parity check signal is received, the parity check signal may be time-shifted based on the determined sampling delay parameter, and the parity check signal after the time shift is aligned with the sampling pulse signal to ensure the correctness when the parity check signal is sampled based on the sampling pulse signal.

In an embodiment, when there is a second sampling data whose target data bit has a value different from the target value corresponding to the target data bit in the first sampling data, the operation of transmitting a first data read instruction to a target memory is returned and performed, until the rising edge of the target level value in each first data signal after the time shift is aligned with the rising edge of the sampling pulse signal; and a time shift length corresponding to each piece of the second sampling data is determined as the first time shift parameter.

Specifically, the computer device samples each first data signal after the time shift along the first direction at the rising edge of the sampling pulse signal to obtain each piece of second sampling data, and determines whether the value of the target data bit in each piece of second sampling data is the same as the target value corresponding to the target data bit in the corresponding first sampling data. When the value of the target data bit in the at least one piece of second sampling data is different from the target value corresponding to the target data bit in the corresponding first sampling data, it is determined that the rising edge of the target level value in each first data signal after the time shift corresponding to the at least one piece of second sampling data is not aligned with the rising edge of the sampling pulse signal, the step of transmitting a first data read instruction to a target memory is returned and performed until the rising edge of the target level value in each first data signal after the time shift is aligned with the rising edge of the sampling pulse signal, and the time shift length corresponding to each first data signal after the time shift during alignment and the first direction are determined as the first time shift parameter.

For example, the target data in the first sampling data obtained by sampling the first data signal of a specific check pin is the $2^{nd}$ bit data bit, a value of the $2^{nd}$ bit data bit is 1, and the corresponding target value is 0, so that after the first data signal after the time shift obtained by time-shifting along the first direction is sampled to obtain the second sampling data, the value of the $2^{nd}$ bit data bit in the second sampling data is obtained. If the value of the $2^{nd}$ bit data bit in the second sampling data is 1, that is, the value 1 of the $2^{nd}$ bit data bit in the second sampling data is different from the target value 0, it is determined that the rising edge of the target level value of the first data signal after the time shift along the first direction is not aligned with the rising edge of the sampling pulse signal, the step of transmitting a first data read instruction to a target memory is returned and performed until the rising edge of the target level value in each first data signal after the time shift is aligned with the rising edge of the sampling pulse signal, and the time shift length corresponding to each first data signal after the time shift during alignment and the first direction are determined as the first time shift parameter.

In the foregoing embodiment, the computer device, when there is a second sampling data whose target data bit has a value different from the target value corresponding to the target data bit in the first sampling data, returns to perform the operation of transmitting a first data read instruction to a target memory, until the rising edge of the target level value in each first data signal after the time shift is aligned with the rising edge of the sampling pulse signal; and determines the time shift length corresponding to each piece of second sampling data as the first time shift parameter, so that a sampling delay parameter of the check pin may be determined based on the first time shift parameter, and after the data signal returned by each check pin is subsequently received, that is, the parity check signal is received, the parity check signal may be time-shifted based on the determined sampling delay parameter, and the parity check signal after the time shift is aligned with the sampling pulse signal to ensure the correctness when the parity check signal is sampled based on the sampling pulse signal.

In an embodiment, a process in which after obtaining the first data signal, the computer device samples the first data signal based on the sampling pulse signal to obtain the first sampling data, and the computer device time-shifts each first data signal along a second direction through the delay circuit to align a falling edge of the target level value in each first data signal after the time shift with a rising edge of the sampling pulse signal to obtain a second time shift parameter specifically includes the following steps: time-shift each first data signal along the second direction through the delay circuit; sample a first data signal after the time shift along the second direction based on the sampling pulse signal to obtain third sampling data; when a value of a target data bit in each piece of the third sampling data is the same as a target value corresponding to a target data bit in the first sampling data, determine that the falling edge of the target level value in each first data signal after the time shift is aligned with the rising edge of the sampling pulse signal; and determine the time shift length corresponding to each piece of the third sampling data as the second time shift parameter.

After obtaining the first data signal, the computer device samples the first data signal based on the sampling pulse signal to obtain the first sampling data, and the value of the data bit corresponding to the target level value of the first data signal in the obtained first sampling data is to be is 1. When the falling edge of the target level value in each first data signal after the time shift is aligned with the rising edge of the sampling pulse signal, that is, when the falling edge of the first high level in each first data signal after the time shift is aligned with the rising edge of the sampling pulse signal, a value of the corresponding bit data bit obtained by sampling the first data signal after the time shift based on the sampling pulse signal is to be 0. As shown in FIG. 15, the data signal corresponding to phase 0 is the first data signal without the time shift, and the value of the first bit data bit in the first sampling data obtained by sampling the first data signal based on the sampling pulse signal is to be 1. The data signal corresponding to phase2 is the first data signal after the time shift, and the value of the first bit data bit in the first sampling data obtained by sampling the first data signal after the time shift based on the sampling pulse signal is to be 0.

Based on this, in this embodiment of this application, the data bit corresponding to the target level value of the first data signal in the first sampling data is determined as the target data bit, and the target value corresponding to the target data bit in the first sampling data is set to 0.

Specifically, after obtaining each first data signal, the computer device samples the first data signal at the rising edge of the sampling pulse signal to obtain each piece of first sampling data, returns to perform the step of transmitting a first data read instruction to a target memory, time-shifts each first data signal along the second direction through the delay circuit to obtain each first data signal after the time shift, and samples each first data signal after the time shift at the rising edge of the sampling pulse signal to obtain each piece of third sampling data. When the value of the target data bit in the third sampling data is the same as the target value corresponding to the target data bit in the corresponding first sampling data, it is determined that the rising edge of the target level value in each first data signal after the time shift is aligned with the rising edge of the sampling pulse signal, and the time shift length of the first data signal after the time shift corresponding to the third sampling data and the second direction are determined as the second time shift parameter.

For example, the target data in the first sampling data obtained by sampling the first data signal of a specific check pin is the $2^{nd}$ bit data bit, a value of the $2^{nd}$ bit data bit is 1, and the corresponding target value is 0, so that after the first data signal after the time shift obtained by time-shifting along the second direction is sampled to obtain the third sampling data, the value of the $2^{nd}$ bit data bit in the third sampling data is obtained. If the value of the $2^{nd}$ bit data bit in the third sampling data is 0, it is determined that the falling edge of the target level value of the first data signal after the time shift along the second direction is aligned with the rising edge of the sampling pulse signal, and the time shift length of the first data signal after the time shift along the second direction and the second direction are determined as the second time shift parameter.

In the foregoing embodiment, the computer device samples the first data signal based on the sampling pulse signal to obtain the first sampling data; time-shifts each first data signal along the second direction through the delay circuit; samples a first data signal after the time shift along the second direction based on the sampling pulse signal to obtain third sampling data; when a value of a target data bit in each piece of the third sampling data is the same as a target value corresponding to a target data bit in the first sampling data, determines that the falling edge of the target level value in each first data signal after the time shift is aligned with the rising edge of the sampling pulse signal; and The time shift length corresponding to each piece of third sampling data is determined as the second time shift parameter, so that a sampling delay parameter of the check pin may be determined based on the second time shift parameter, and after the data signal returned by each check pin is subsequently received, that is, the parity check signal is received, the parity check signal may be time-shifted based on the determined sampling delay parameter, and the parity check signal after the time shift is aligned with the sampling pulse signal to ensure the correctness when the parity check signal is sampled based on the sampling pulse signal.

In an embodiment, when there is a third sampling data whose target data bit has a value different from the target value corresponding to the target data bit in the first sampling data, the operation of transmitting a first data read instruction to a target memory is returned and performed, until the falling edge of the target level value in each first data signal after the time shift is aligned with the rising edge of the sampling pulse signal; and the time shift length corresponding to each piece of the third sampling data is determined as the second time shift parameter.

Specifically, the computer device samples each first data signal after the time shift along the second direction based on the rising edge of the sampling pulse signal to obtain each piece of third sampling data, and determines whether the value of the target data bit in each piece of third sampling data is the same as the target value corresponding to the target data bit in the corresponding first sampling data. When the value of the target data bit in the at least one piece of third sampling data is different from the target value corresponding to the target data bit in the corresponding first sampling data, it is determined that the falling edge of the target level value in each first data signal after the time shift corresponding to the at least one piece of third sampling data is not aligned with the rising edge of the sampling pulse signal, the step of transmitting a first data read instruction to a target memory is returned and performed until the falling edge of the target level value in each first data signal after the time shift is aligned with the rising edge of the sampling pulse signal, and the time shift length corresponding to each first data signal after the time shift during alignment and the first direction are determined as the second time shift parameter.

For example, the target data in the first sampling data obtained by sampling the first data signal of a specific check pin is the $2^{nd}$ bit data bit, a value of the $2^{nd}$ bit data bit is 1, and the corresponding target value is 0, so that after the first data signal after the time shift obtained by time-shifting along the first direction is sampled to obtain the third sampling data, the value of the $2^{nd}$ bit data bit in the third sampling data is obtained. If the value of the $2^{nd}$ bit data bit in the third sampling data is 1, that is, the value 1 of the $2^{nd}$ bit data bit in the third sampling data is different from the target value 0, it is determined that the falling edge of the target level value of the first data signal after the time shift along the first direction is not aligned with the rising edge of the sampling pulse signal, the step of transmitting a first data read instruction to a target memory is returned and performed until the falling edge of the target level value in each first data signal after the time shift is aligned with the rising edge of the sampling pulse signal, and the time shift length corresponding to each first data signal after the time shift during alignment and the first direction are determined as the second time shift parameter.

In the foregoing embodiment, the computer device, when there is a third sampling data whose target data bit has a value different from the target value corresponding to the target data bit in the first sampling data, returns to perform the operation of transmitting a first data read instruction to a target memory, until the falling edge of the target level value in each first data signal after the time shift is aligned with the rising edge of the sampling pulse signal; and determines the time shift length corresponding to each piece of third sampling data as the second time shift parameter, so that a sampling delay parameter of the check pin may be determined based on the second time shift parameter, and after the data signal returned by each check pin is subsequently received, that is, the parity check signal is received, the parity check signal may be time-shifted based on the determined sampling delay parameter, and the parity check signal after the time shift is aligned with the sampling pulse signal to ensure the correctness when the parity check signal is sampled based on the sampling pulse signal.

Figure 17:
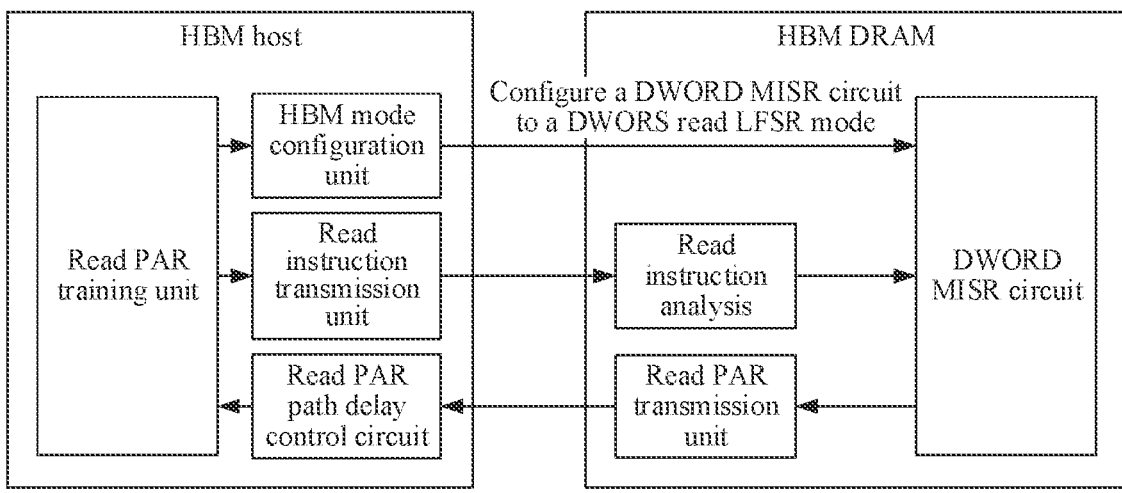
FIG. 17 is a diagram of an architecture of a check pin processing system of a memory according to an embodiment.

This application further provides an application scenario, and the processing method for a check pin of a memory is applied to the application scenario. Specifically, combined with the system architectural diagram shown in FIG. 17, the application of the processing method for a check pin of a memory in this application scenario is as follows:

Step 1: Set an operating mode of HBM DRAM as a target mode.

Specifically, an operating mode configuration instruction is transmitted to HBM DRAM through a mode configuration unit of a HBM host, so that HBM DRAM configures HBM DRAM as a DWORD read LFSR mode based on the operating mode configuration instruction.

Step 2: Transmit a read instruction to the HBM DRAM.

Specifically, HBM host transmits a read instruction to HBM DRAM through an instruction transmission unit. HBM DRAM analyzes the received read instruction, inputs an analysis result into a DWORD MISR circuit, outputs read data through the DWORD MISR circuit, and returns a target data bit in the read data to the HBM host through a read PAR transmission unit.

Step 3: Receive read PAR data returned by each PAR pin.

Specifically, a read PAR data signal and a sampling pulse signal (RDQS) returned by each PAR pin are received respectively.

Step 4: per PAR training stage.

Specifically, a PAR read training unit determines whether an eye diagram center of a first high level of each PAR data signal is aligned with a rising edge of the sampling pulse signal (RDQS). If both are aligned, step 5 is performed; if the eye diagram center of the first high level of at least one read PAR data signal is not aligned with the rising edge of the sampling pulse signal (RDQS), a read PAR path delay control circuit is used to adjust the delay on a PAR path corresponding to the at least one read PAR data signal, and step 2 and step 3 are returned and performed. After each read PAR data signal is received, the corresponding read PAR data signal is time-shifted based on the determined delay, and whether the eye diagram center of the first high level of each read PAR data signal after the time shift is aligned with the rising edge of the sampling pulse signal (RDQS). If both are aligned, step 5 is performed; and if the eye diagram center of the first high level of at least one read PAR data signal after the time shift is not aligned with the rising edge of the sampling pulse signal (RDQS), the read PAR path delay control circuit is used to adjust the delay on a PAR path corresponding to the at least one read PAR data signal after the time shift, and step 2 and step 3 are returned and performed until the eye diagram centers of the first high levels of all read PAR data signals after the time shift are aligned with the rising edge of the sampling pulse signal (RDQS). The delay corresponding to each PAR pin during alignment is determined as the first delay parameter.

For example, as shown in FIG. 15, an initial state of a data signal of a specific PAR pin is phase 0. The data signal of the read PAR in the phase 0 state is sampled based on the pulse signal, and a value of the $2^{nd}$ bit data bit in the sampling data is obtained as 1.

The circuit delay corresponding to the PAR pin is continuously increased through a Step Counter. Eventually, the data signal of the PAR pin reaches a Phase 1 state. The data signal of the read PAR in the phase 1 state is sampled, and the value of the $2^{nd}$ bit data bit in the sampling data is 0. In this case, a value of the Step Counter is recorded as R_CNT, and R_CNT is a first delay parameter of the PAR pin.

The circuit delay corresponding to the PAR pin is continuously decreased by adjusting the Step Counter. Eventually, the data signal of the PAR pin reaches a Phase 2 state. The data signal of the read PAR in the phase 2 state is sampled, and the value of the $2^{nd}$ bit data bit in the sampling data is 0. In this case, a value of the Step Counter is recorded as L_CNT, and L_CNT is a second delay parameter of the PAR pin.

Then, it is concluded that when the circuit delay of the PAR pin is (R_CNT+L_CNT)/2, the PAR data signal outputted by the delay circuit of the PAR pin may be aligned with the rising edge of a sampling pulse clock.

Step 5: per slice training stage.

Step 2 and step 3 are returned and performed, the read PAR data signal returned by each PAR pin is initially time-shifted based on the first delay parameter determined in step 4 to obtain a read PAR data signal after the initial time shift, and a read PAR training unit determines whether the first high level of each read PAR data signal after the initial time shift is aligned. If the first high level of at least one read PAR data signal after the initial time shift is not aligned with the first high levels of other read PAR data signals after the initial time shift, the read PAR path delay control circuit is used to adjust the delay on a PAR path corresponding to the at least one read PAR data signal, and step 2 and step 3 are returned and performed. After each read PAR data signal is received, time shift is performed based on the determined first delay parameter and the read PAR data signal corresponding to the delayed, other read PAR data signals are time-shifted based on the determined first delay parameter, and whether the first high level of each read PAR data signal after the time shift is aligned is determined. If the first high level of at least one read PAR data signal after the time shift is not aligned with the first high levels of other read PAR data signals after the time shift, the read PAR path delay control circuit is used to adjust the delay on a PAR path corresponding to the at least one read PAR data signal, and step 2 and step 3 are returned and performed until the first high level of each read PAR data signal after the time shift is aligned, and the delay determined in this stage of each read PAR data signal after the time shift during alignment is determined as the second delay parameter.

For example, at this stage, after the read PAR data signal after the initial time shift is received through the delay circuit of each PAR pin, each read PAR data signal after the initial time shift is sampled based on the sampling pulse to obtain each piece of sampling data. If the first "1" data bit in each piece of sampling data is the same, it is determined that the first high level of the read PAR data signal after the each initial time shift has been aligned; and if a first "1" data bit in at least one piece of sampling data is different from the first "1" data bit in other pieces of sampling data (as shown in FIG. 16B), it is determined that the first high level of at least one read PAR data signal after the initial time shift is not aligned with the first high levels of other read PAR data signals after the initial time shift, the read PAR path delay control circuit is used to adjust the delay on a PAR path corresponding to the at least one read PAR data signal, and step 2 and step 3 are returned and performed until the first high level of each read PAR data signal after the time shift is aligned (as shown in FIG. 16C), and the delay determined in this stage of each read PAR data signal after the time shift during alignment is determined as the second delay parameter.

Through the foregoing processing method for a check pin of a memory, the following technical effect may be achieved.

1. Before an initial operation of a HBM chip bring up, a mechanism of this application may be used to train a read PAR pin, which may ensure that when the HBM chip initially operates, if the back-end timing does not converge and a production failure of the HBM chip causes a sampling error in a read PAR path of the chip, the accuracy of PAR data returned by HBM DRAM is ensured when the chip is initially operating, thereby ensuring that no errors will occur during a process of checking read data by a HBM Host;

2. When the HBM chip detects significant drift in PVT (Process, Voltage and Temperature), software configures the chip to perform training on the read PAR pin to ensure that the chip will not cause a data transmission error in the read PAR path of the chip due to PVT drift;

3. A mechanism of regular PAR read training included in hardware may be used to regularly perform PAR read training on the HBM chip to ensure that the chip will not have sampling errors in the read PAR in the operating process; and 4. Since this application supports single-step PAR read training configured by software, the PAR read training for the entire chip may also be completed by software configuration alone. Since the software may complete this action when a system is not busy, it may ensure that there will be no sampling errors of the read PAR pin and at the same time ensure the efficiency of the entire system.

It is to be understood that, steps in the related flowcharts of the foregoing embodiments are displayed in sequence based on indication of arrows, but the steps are not necessarily performed in sequence based on a sequence indicated by the arrows. Unless otherwise explicitly specified in this specification, execution of the steps is not strictly limited, and the steps may be performed in other sequences. In addition, at least some steps in the related flowcharts in the foregoing embodiments may include a plurality of steps or a plurality of stages. The steps or the stages are not necessarily performed at the same moment, but may be performed at different moments. The steps or the stages are not necessarily performed in sequence, but may be performed in turn or alternately with another step or at least some of steps or stages of the another step.

Based on the same invention concept, an embodiment of this application further provides a processing apparatus for a check pin of a memory configured to perform the foregoing processing method for a check pin of a memory. The implementation solution for solving the problem provided by this apparatus is similar to the implementation solution recorded in the foregoing method. Therefore, for the specific limitations in one or more embodiments of the processing apparatus for a check pin of a memory provided below, reference may be made to the foregoing limitations for the processing method for a check pin of a memory, and the description is not repeated herein again.

Figure 18:
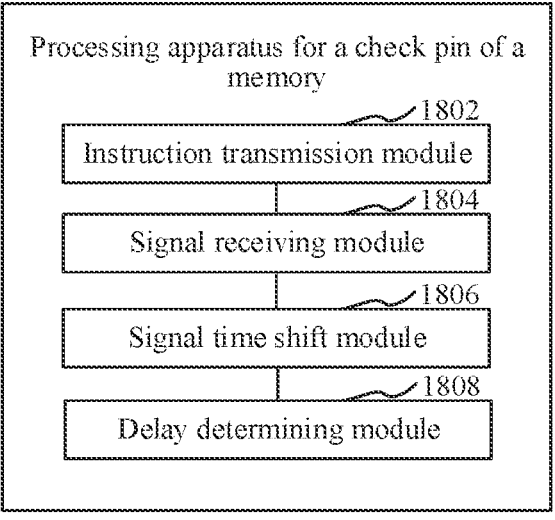
FIG. 18 is a block diagram of a structure of a processing apparatus for a check pin of a memory according to an embodiment.

In an embodiment, as shown in FIG. 18, a processing apparatus for a check pin of a memory is provided, including: an instruction transmission module 1802, a signal receiving module 1804, a signal time shift module 1806, and a delay determining module 1808, where the instruction transmission module 1802 is configured to transmit a first data read instruction to a target memory;

the signal receiving module 1804 is configured to receive a first data signal and a sampling pulse signal returned by each check pin in the target memory;

the signal time shift module 1806 is configured to time-shift each first data signal through a delay circuit to align a target level value in each first data signal after the time shift with the sampling pulse signal to obtain a first delay parameter; and when receiving a second data signal returned by each check pin in the target memory, time-shift a target data signal in each second data signal through the delay circuit to align target level values in all second data signals after the time shift to obtain a second delay parameter; and the delay determining module 1808 is configured to determine a sampling delay parameter of the check pin based on the first delay parameter and the second delay parameter.

In the foregoing embodiment, through transmitting a first data read instruction to a target memory; receiving a first data signal and a sampling pulse signal returned by each check pin in the target memory; time-shifting each first data signal through a delay circuit to align a target level value in each first data signal after the time shift with the sampling pulse signal to obtain a first delay parameter; and when receiving a second data signal returned by each check pin in the target memory, time-shifting a target data signal in each second data signal through the delay circuit to align target level values in all second data signals after the time shift to obtain a second delay parameter, a sampling delay parameter of the check pin is determined based on the first delay parameter and the second delay parameter, so that after the data signal returned by each check pin is subsequently received, that is, the parity check signal is received, the parity check signal may be time-shifted based on the determined sampling delay parameter, and the parity check signal after the time shift is aligned with the sampling pulse signal to ensure the correctness when the parity check signal is sampled based on the sampling pulse signal.

Figure 19:
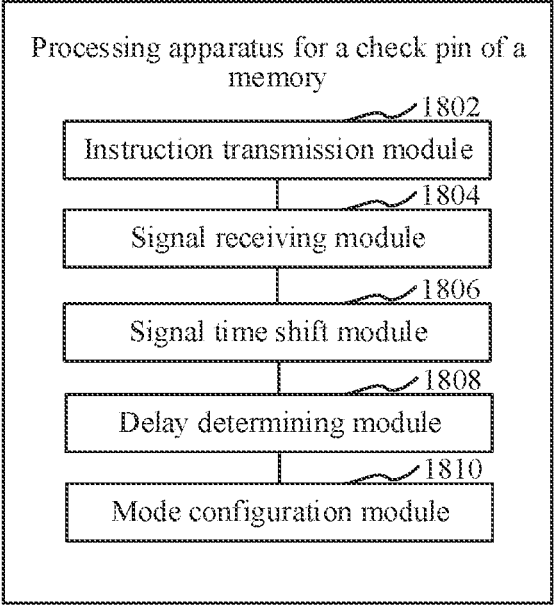
FIG. 19 is a block diagram of a structure of a processing apparatus for a check pin of a memory according to another embodiment.

In an embodiment, as shown in FIG. 19, the apparatus further includes: a mode configuration module 1810, where the mode configuration module 1810 is configured to transmit an operating mode configuration instruction to the target memory to cause the target memory to configure a target mode based on the operating mode configuration instruction; and the instruction transmission module 1802 is further configured to: transmit the first data read instruction to a target memory in the target mode.

In an embodiment, the mode configuration module 1810 is further configured to: initialize a read instruction processing circuit of the target memory; and configure, based on the operating mode configuration instruction, an operating mode of the read instruction processing circuit as the target mode.

In an embodiment, the first data signal is generated based on a target data bit in read data; and the read data is data read by the target memory from a register of the target memory based on the first data read instruction.

In an embodiment, the signal time shift module 1806 is further configured to: time-shift each first data signal along a first direction through the delay circuit to align a rising edge of the target level value in each first data signal after the time shift with a rising edge of the sampling pulse signal to obtain a first time shift parameter; time-shift each first data signal along a second direction through the delay circuit to align a falling edge of the target level value in each first data signal after the time shift with the rising edge of the sampling pulse signal to obtain a second time shift parameter, where the first direction and the second direction are opposite directions; and determine the first delay parameter corresponding to each check pin based on the first time shift parameter and the second time shift parameter.

In an embodiment, the signal time shift module 1806 is further configured to: sample the first data signal based on the sampling pulse signal to obtain first sampling data; time-shift each first data signal along the first direction through the delay circuit; sample a first data signal after the time shift along the first direction based on the sampling pulse signal to obtain second sampling data; when a value of a target data bit in each piece of the second sampling data is the same as a target value corresponding to a target data bit in the first sampling data, determine that the rising edge of the target level value in each first data signal after the time shift is aligned with the rising edge of the sampling pulse signal; and determine a time shift length corresponding to each piece of the second sampling data as the first time shift parameter.

In an embodiment, the signal time shift module 1806 is further configured to: when there is a second sampling data whose target data bit has a value different from the target value corresponding to the target data bit in the first sampling data, return to perform the operation of transmitting a first data read instruction to a target memory through the instruction transmission module 1802, until the rising edge of the target level value in each first data signal after the time shift is aligned with the rising edge of the sampling pulse signal; and determine a time shift length corresponding to each piece of the second sampling data as the first time shift parameter.

In an embodiment, the signal time shift module 1806 is further configured to: sample the first data signal based on the sampling pulse signal to obtain first sampling data; time-shift each first data signal along the second direction through the delay circuit; sample a first data signal after the time shift along the second direction based on the sampling pulse signal to obtain third sampling data; when a value of a target data bit in each piece of the third sampling data is the same as a target value corresponding to a target data bit in the first sampling data, determine that the falling edge of the target level value in each first data signal after the time shift is aligned with the rising edge of the sampling pulse signal; and determine the time shift length corresponding to each piece of the third sampling data as the second time shift parameter.

In an embodiment, the signal time shift module 1806 is further configured to: when there is a third sampling data whose target data bit has a value different from the target value corresponding to the target data bit in the first sampling data, return to perform the operation of transmitting a first data read instruction to a target memory through the instruction transmission module 1802, until the falling edge of the target level value in each first data signal after the time shift is aligned with the rising edge of the sampling pulse signal; and determine the time shift length corresponding to each piece of the third sampling data as the second time shift parameter.

In an embodiment, after the time-shifting each first data signal through a delay circuit to align a target level value in each first data signal after the time shift with the sampling pulse signal, the instruction transmission module 1802 is further configured to: transmit a second data read instruction to the target memory; and the signal receiving module 1804 is further configured to: receive a second data signal and a sampling pulse signal returned by each check pin in the target memory.

In an embodiment, the signal time shift module 1806 is further configured to: sample, based on the sampling pulse signal, each second data signal after the time shift based on the first delay parameter to obtain fourth sampling data;

when a target data bit of target sampling data in the fourth sampling data is different from target data bits of other fourth sampling data, determine that the target data signal in the second data signal is not aligned with other target level values in the second data signal; and time-shift the target data signal in the second data signal through the delay circuit to align the target level value in each second data signal after the time shift to obtain the second delay parameter.

Each module in the foregoing processing apparatus for a check pin of a memory may be implemented in whole or in part by software, hardware, and combinations thereof. The foregoing modules may be built in or independent of a processor of a computer device in a hardware form, or may be stored in a memory of the computer device in a software form, so that the processor invokes and performs an operation corresponding to each of the foregoing modules. In this application, the term "module" in this application refers to a computer program or part of the computer program that has a predefined function and works together with other related parts to achieve a predefined goal and may be all or partially implemented by using software, hardware (e.g., processing circuitry and/or memory configured to perform the predefined functions), or a combination thereof. Each module can be implemented using one or more processors (or processors and memory). Likewise, a processor (or processors and memory) can be used to implement one or more modules. Moreover, each module can be part of an overall module that includes the functionalities of the module.

In an embodiment, a computer device is provided. The computer device may be a server, and an internal structure diagram thereof may be shown in FIG. 20. The computer device includes a processor, a memory, an input/output (I/O for short) interface, and a communication interface. The processor, the memory, and the input/output interface are connected through a system bus, and the communication interface is connected to the system bus through the input/output interface. The processor of the computer device is configured to provide computing and control capabilities. The memory of the computer device includes a non-volatile storage medium and an internal memory. The non-volatile storage medium stores an operating system, a computer program, and a database. The internal memory provides an environment for running of the operating system and the computer program in the non-volatile storage medium. The database of the computer device is configured to store parity check data. The input/output interface of the computer device is configured to exchange information between the processor and an external device. The communication interface of the computer device is configured to communicate with an external terminal through a network connection. The computer program is executed by the processor to implement a processing method for a check pin of a memory.

In an embodiment, a computer device is provided. The computer device may be a terminal, and an internal structure diagram thereof may be shown in FIG. 21. The computer device includes a processor, a memory, an input/output interface, a communication interface, a display unit, and an input apparatus. The processor, the memory, and the input/output interface are connected through a system bus, and the communication interface, the display unit, and the input apparatus are connected to the system bus through the input/output interface. The processor of the computer device is configured to provide computing and control capabilities. The memory of the computer device includes a non-volatile storage medium and an internal memory. The non-volatile storage medium stores an operating system and a computer program. The internal memory provides an environment for running of the operating system and the computer program in the non-volatile storage medium. The input/output interface of the computer device is configured to exchange information between the processor and an external device. The communication interface of the computer device is configured to communicate with an external terminal in a wired or a wireless manner, and the wireless manner can be implemented by using WIFI, a mobile cellular network, an NFC (near field communication), or other technologies. The computer program is executed by the processor to implement a processing method for a check pin of a memory. The display unit of the computer device is configured to form a visually visible picture, and may be a display screen, a projection apparatus, or a virtual reality imaging apparatus. The display screen may be a liquid crystal display screen or an electronic ink display screen. The input apparatus of the computer device may be a touch layer covering the display screen, or may be a key, a trackball, or a touch pad disposed on a housing of the computer device, or may be an external keyboard, a touch pad, a mouse, or the like.

Figure 20:
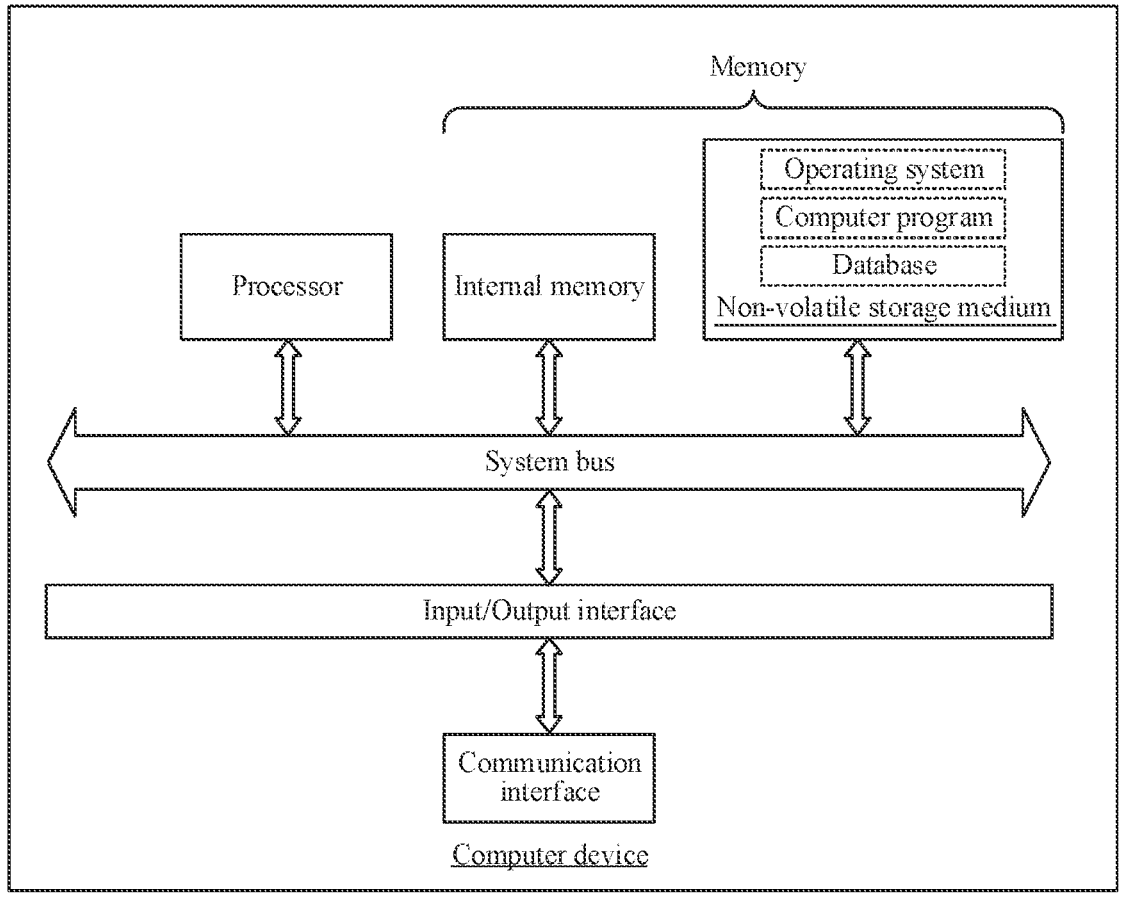
FIG. 20 is a diagram of an internal structure of a computer device according to an embodiment.
Figure 21:
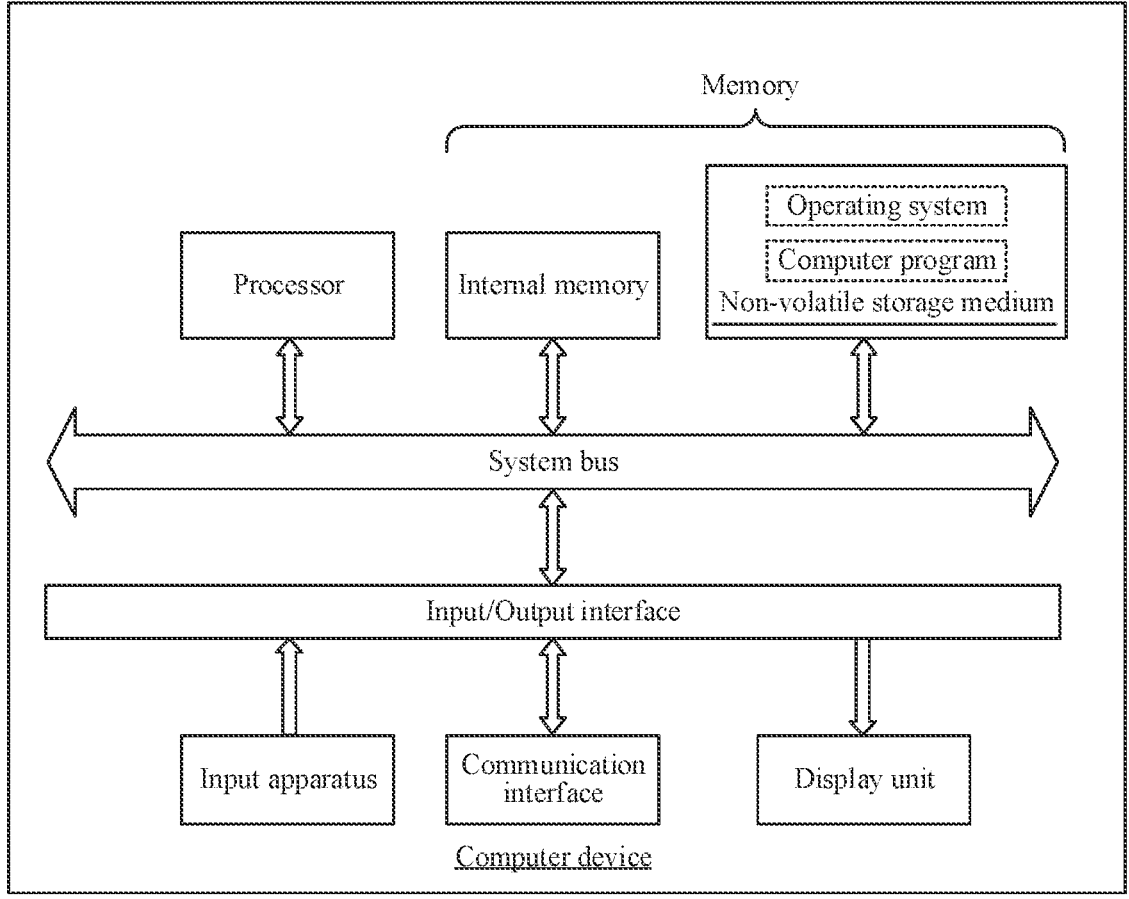
FIG. 21 is a diagram of an internal structure of a computer device according to another embodiment.

A person skilled in the art may understand that, the structure shown in FIG. 20 or FIG. 21 is only a block diagram of a part of a structure related to a solution of this application and does not limit the computer device to which the solution of this application is applied. Specifically, the computer device may include more or fewer components than those in the drawings, or some components are combined, or a different component deployment is used.

In an embodiment, a computer device is further provided, including a memory and a processor, the memory storing a computer program, when executed by the processor, causing the processor to perform the steps in the foregoing method embodiments.

In an embodiment, a non-transitory computer-readable storage medium is provided, storing a computer program, and the computer program, when executed by a processor, implements the steps in the foregoing method embodiments.

In an embodiment, a computer program product is provided, storing a computer program, and the computer program, when executed by a processor, implements the steps in the foregoing method embodiments.

The user information (including, but not limited to, user equipment information, user personal information, and the like) and the data (including, but not limited to, data for analysis, stored data, displayed data, and the like) involved in this application all are information and data authorized by the user or fully authorized by each party, and the collection, use, and processing of relevant data need to comply with relevant laws and regulations of relevant countries and regions.

A person of ordinary skill in the art may understand that all or some of procedures of the method in the foregoing embodiments may be implemented by a computer program instructing relevant hardware. The computer program may be stored in a non-transitory computer-readable storage medium. When the computer program is executed, the procedures of the foregoing method embodiments may be implemented. Any reference to a memory, a database, or another medium used in the embodiments provided in this application may include at least one of a non-volatile memory and a volatile memory. The non-volatile memory may include a read-only memory (ROM), a magnetic tape, a floppy disk, a flash memory, an optical memory, a high-density embedded non-volatile memory, a resistive random access memory (ReRAM), a magnetoresistive random access memory (MRAM), a ferroelectric random access memory (FRAM), a phase change memory (PCM), a graphene memory, and the like. The volatile memory may include a random access memory (RAM) or an external cache. For the purpose of description instead of limitation, the RAM is available in a plurality of forms, such as a static random access memory (SRAM) or a dynamic random access memory (DRAM). The database involved in the embodiments provided in this application may include at least one of a relational database and a non-relational database. The non-relational database may include a blockchain-based distributed database, but is not limited thereto. The processor involved in the embodiments provided in this application may be a general-purpose processor, a central processing unit, a graphics processing unit, a digital signal processor, a programmable logic device, a quantum computing-based data processing logic device, and are not limited thereto.

The technical features in the foregoing embodiments may be randomly combined. For concise description, not all possible combinations of the technical features in the embodiment are described. However, provided that combinations of the technical features do not conflict with each other, the combinations of the technical features are considered as falling within the scope recorded in this specification.

The foregoing embodiments only describe several implementations of this application, which are described specifically and in detail, but cannot be construed as a limitation to the patent scope of this application. A person of ordinary skill in the art may make various changes and improvements without departing from the ideas of this application, which shall all fall within the protection scope of this application. Therefore, the protection scope of this application is subject to the protection scope of the appended claims.

What is claimed is:

1. A processing method for configuring a check pin of a memory, performed by a computer device, the method comprising:

transmitting a first data read instruction to a target memory;

receiving a first data signal and a sampling pulse signal returned by the check pin in the target memory;

time-shifting each first data signal through a delay circuit by a first time shift to align a target level value in each first data signal after the first time shift with the sampling pulse signal to obtain a first delay parameter;

transmitting a second data read instruction to the target memory;

receiving a second data signal returned by the check pin in the target memory;

time-shifting each second data signal through the delay circuit by the first time shift based on the first delay parameter to obtain a time-shifted second data signal;

time-shifting the target data signal in each time-shifted second data signal through the delay circuit by a second time shift to align target level values in the time-shifted second data signals after the second time shift with the sampling pulse signal to obtain a second delay parameter; and determining a sampling delay parameter of the check pin based on a sum of the first delay parameter and the second delay parameter, wherein the determined sampling delay parameter is used for time-shifting a parity check signal received from the check pin in the target memory to ensure correctness when the time-shifted parity check signal is sampled based on the sampling pulse signal.

2. The method according to claim 1, wherein the method further comprises:

transmitting an operating mode configuration instruction to the target memory to cause the target memory to configure a target mode based on the operating mode configuration instruction; and transmitting the first data read instruction to a target memory in the target mode.

3. The method according to claim 2, wherein the configuration of the target mode based on the operating mode configuration instruction comprises:

initializing a read instruction processing circuit of the target memory; and configuring, based on the operating mode configuration instruction, an operating mode of the read instruction processing circuit as the target mode.

4. The method according to claim 1, wherein the first data signal is generated based on a target data bit in read data; and the read data is data read by the target memory from a register of the target memory based on the first data read instruction.

5. The method according to claim 1, wherein the time-shifting each first data signal through a delay circuit to align a target level value in each first data signal after the time shift with the sampling pulse signal to obtain a first delay parameter comprises:

time-shifting each first data signal along a first direction through the delay circuit to align a rising edge of the target level value in each first data signal after the time shift with a rising edge of the sampling pulse signal to obtain a first time shift parameter;

time-shifting each first data signal along a second direction through the delay circuit to align a falling edge of the target level value in each first data signal after the time shift with the rising edge of the sampling pulse signal to obtain a second time shift parameter, wherein the first direction and the second direction are opposite directions; and determining the first delay parameter corresponding to each check pin based on the first time shift parameter and the second time shift parameter.

6. The method according to claim 1, wherein the method further comprises:

sampling, based on the sampling pulse signal, each second data signal after the time shift based on the first delay parameter to obtain fourth sampling data;

when a target data bit of target sampling data in each piece of the fourth sampling data is different from target data bits of other fourth sampling data, determining that the target data signal in the second data signal is not aligned with other target level values in the second data signal; and time-shifting the target data signal in the second data signal through the delay circuit to align the target level value in each second data signal after the time shift to obtain the second delay parameter.

7. A computer device, comprising a memory and a processor, the memory storing a computer program that, when executed by the processor, causes the computer device to perform a processing method for configuring a check pin of a memory including:

transmitting a first data read instruction to a target memory;

receiving a first data signal and a sampling pulse signal returned by the check pin in the target memory;

time-shifting each first data signal through a delay circuit to align a target level value in each first data signal after the time shift with the sampling pulse signal to obtain a first delay parameter;

receiving a second data signal returned by each check pin in the target memory;

transmitting a second data read instruction to the target memory:

receiving a second data signal returned by the check pin in the target memory;

time-shifting each second data signal through the delay circuit by the first time shift based on the first delay parameter to obtain a time-shifted second data signal;

time-shifting the target data signal in each time-shifted second data signal through the delay circuit by a second time shift to align target level values in the time-shifted second data signals after the second time shift with the sampling pulse signal to obtain a second delay parameter; and determining a sampling delay parameter of the check pin based on a sum of the first delay parameter and the second delay parameter, wherein the determined sampling delay parameter is used for time-shifting a parity check signal received from the check pin in the target memory to ensure correctness when the time-shifted parity check signal is sampled based on the sampling pulse signal.

8. The computer device according to claim 7, wherein the method further comprises:

transmitting an operating mode configuration instruction to the target memory to cause the target memory to configure a target mode based on the operating mode configuration instruction; and transmitting the first data read instruction to a target memory in the target mode.

9. The computer device according to claim 8, wherein configuration of the target mode based on the operating mode configuration instruction comprises:

initializing a read instruction processing circuit of the target memory; and configuring, based on the operating mode configuration instruction, an operating mode of the read instruction processing circuit as the target mode.

10. The computer device according to claim 7, wherein the first data signal is generated based on a target data bit in read data; and the read data is data read by the target memory from a register of the target memory based on the first data read instruction.

11. The computer device according to claim 7, wherein the time-shifting each first data signal through a delay circuit to align a target level value in each first data signal after the time shift with the sampling pulse signal to obtain a first delay parameter comprises:

time-shifting each first data signal along a first direction through the delay circuit to align a rising edge of the target level value in each first data signal after the time shift with a rising edge of the sampling pulse signal to obtain a first time shift parameter;

time-shifting each first data signal along a second direction through the delay circuit to align a falling edge of the target level value in each first data signal after the time shift with the rising edge of the sampling pulse signal to obtain a second time shift parameter, wherein the first direction and the second direction are opposite directions; and determining the first delay parameter corresponding to each check pin based on the first time shift parameter and the second time shift parameter.

12. The computer device according to claim 7, wherein the method further comprises:

sampling, based on the sampling pulse signal, each second data signal after the time shift based on the first delay parameter to obtain fourth sampling data;

when a target data bit of target sampling data in each piece of the fourth sampling data is different from target data bits of other fourth sampling data, determining that the target data signal in the second data signal is not aligned with other target level values in the second data signal; and time-shifting the target data signal in the second data signal through the delay circuit to align the target level value in each second data signal after the time shift to obtain the second delay parameter.

13. A non-transitory computer-readable storage medium, storing a computer program therein, and the computer program, when executed by a processor of a computer device, causing the computer device to perform a processing method for configuring a check pin of a memory including:

transmitting a first data read instruction to a target memory;

receiving a first data signal and a sampling pulse signal returned by the check pin in the target memory;

time-shifting each first data signal through a delay circuit to align a target level value in each first data signal after the time shift with the sampling pulse signal to obtain a first delay parameter;

receiving a second data signal returned by each check pin in the target memory;

time-shifting each first data signal through a delay circuit by a first time shift to align a target level value in each first data signal after the first time shift with the sampling pulse signal to obtain a first delay parameter;

transmitting a second data read instruction to the target memory;

receiving a second data signal returned by the check pin in the target memory;

time-shifting each second data signal through the delay circuit by the first time shift based on the first delay parameter to obtain a time-shifted second data signal;

time-shifting the target data signal in each time-shifted second data signal through the delay circuit by a second time shift to align target level values in the time-shifted second data signals after the second time shift with the sampling pulse signal to obtain a second delay parameter; and determining a sampling delay parameter of the check pin based on a sum of the first delay parameter and the second delay parameter, wherein the determined sampling delay parameter is used for time-shifting a parity check signal received from the check pin in the target memory to ensure correctness when the time-shifted parity check signal is sampled based on the sampling pulse signal.

14. The non-transitory computer-readable storage medium according to claim 13, wherein the method further comprises:

transmitting an operating mode configuration instruction to the target memory to cause the target memory to configure a target mode based on the operating mode configuration instruction; and transmitting the first data read instruction to a target memory in the target mode.

15. The non-transitory computer-readable storage medium according to claim 14, wherein the configuration of the target mode based on the operating mode configuration instruction comprises:

initializing a read instruction processing circuit of the target memory; and configuring, based on the operating mode configuration instruction, an operating mode of the read instruction processing circuit as the target mode.

16. The non-transitory computer-readable storage medium according to claim 13, wherein the first data signal is generated based on a target data bit in read data; and the read data is data read by the target memory from a register of the target memory based on the first data read instruction.

17. The non-transitory computer-readable storage medium according to claim 13, wherein the time-shifting each first data signal through a delay circuit to align a target level value in each first data signal after the time shift with the sampling pulse signal to obtain a first delay parameter comprises:

time-shifting each first data signal along a first direction through the delay circuit to align a rising edge of the target level value in each first data signal after the time shift with a rising edge of the sampling pulse signal to obtain a first time shift parameter;

time-shifting each first data signal along a second direction through the delay circuit to align a falling edge of the target level value in each first data signal after the time shift with the rising edge of the sampling pulse signal to obtain a second time shift parameter, wherein the first direction and the second direction are opposite directions; and determining the first delay parameter corresponding to each check pin based on the first time shift parameter and the second time shift parameter.

18. The non-transitory computer-readable storage medium according to claim 13, wherein the method further comprises:

sampling, based on the sampling pulse signal, each second data signal after the time shift based on the first delay parameter to obtain fourth sampling data;

when a target data bit of target sampling data in each piece of the fourth sampling data is different from target data bits of other fourth sampling data, determining that the target data signal in the second data signal is not aligned with other target level values in the second data signal; and time-shifting the target data signal in the second data signal through the delay circuit to align the target level value in each second data signal after the time shift to obtain the second delay parameter.

* * * * *